US012444675B2

(12) United States Patent
Lee et al.

(10) Patent No.: US 12,444,675 B2
(45) Date of Patent: Oct. 14, 2025

(54) SEMICONDUCTOR DEVICES

(71) Applicant: Samsung Electronics Co., Ltd., Suwon-si (KR)

(72) Inventors: Euibok Lee, Seoul (KR); Rakhwan Kim, Suwon-si (KR); Wandon Kim, Seongnam-Si (KR); Sunyoung Noh, Hwaseong-si (KR); Hanmin Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 872 days.

(21) Appl. No.: 17/705,343

(22) Filed: Mar. 27, 2022

(65) Prior Publication Data

US 2023/0011088 A1 Jan. 12, 2023

(30) Foreign Application Priority Data

Jul. 7, 2021 (KR) ........................ 10-2021-0088976

(51) Int. Cl.

| | |
|---|---|
| ***H01L 23/522*** | (2006.01) |
| ***H01L 23/528*** | (2006.01) |
| ***H01L 23/532*** | (2006.01) |

(52) U.S. Cl.

CPC ...... *H01L 23/5226* (2013.01); *H01L 23/5283* (2013.01); *H01L 23/53209* (2013.01); *H01L 23/53228* (2013.01); *H01L 23/53257* (2013.01)

(58) Field of Classification Search

CPC ............. H01L 23/5226; H01L 23/5283; H01L 21/76897; H01L 21/76885; H01L 21/76816; H01L 21/76804; H01L 21/76877

See application file for complete search history.

(56) References Cited

U.S. PATENT DOCUMENTS

| | | | |
|---|---|---|---|
| 4,536,951 | A | 8/1985 | Rhodes et al. |
| 6,133,635 | A | 10/2000 | Bothra et al. |
| 7,303,988 | B2 | 12/2007 | Shim |
| 9,324,652 | B2 | 4/2016 | Chandhok et al. |
| 10,083,905 | B2 * | 9/2018 | Briggs .............. H01L 21/76813 |
| 10,643,895 | B2 | 5/2020 | Mebarki et al. |
| 11,094,744 | B2 * | 8/2021 | Chen .................... H10N 70/063 |
| 2011/0275214 | A1 | 11/2011 | Ryan |
| 2012/0104622 | A1 * | 5/2012 | Kim .................... H01L 21/7681 257/774 |
| 2018/0261511 | A1 | 9/2018 | Rubin et al. |

(Continued)

*Primary Examiner* — Bac H Au

(74) *Attorney, Agent, or Firm* — Muir Patent Law, PLLC

(57) ABSTRACT

A semiconductor device includes a lower structure including a substrate, a first interconnection layer extending in a first direction on the lower structure, and including a first metal, a first via contacting a portion of an upper surface of the first interconnection layer and including a second metal, a second via contacting at least a portion of an upper surface of the first via and having a maximum width narrower than a maximum width of the first via, and a second interconnection layer connected to the second via and extending in a second direction. The first interconnection layer has inclined side surfaces in which a width of the first interconnection layer becomes narrower towards an upper region of the first interconnection layer, and the first via has inclined side surfaces in which a width of the first via becomes narrower towards an upper region of the first via.

20 Claims, 32 Drawing Sheets

(56) References Cited

U.S. PATENT DOCUMENTS

2019/0021176 A1* 1/2019 Law ..................... H05K 3/4038
2019/0096757 A1 3/2019 Bruce et al.
2020/0135640 A1* 4/2020 Sio ...................... H01L 23/5226
2020/0243377 A1 7/2020 Liu
2020/0373241 A1* 11/2020 Gerousis ............. H01L 23/5283
2021/0043507 A1 2/2021 Motoyama et al.
2022/0077059 A1* 3/2022 Wu ....................... H01L 23/535
2022/0344264 A1* 10/2022 Yao ...................... H01L 23/535

* cited by examiner 100g
270
260
250
220
210
205
201
166
165
162
160
105
110
101
II'
II
SC2
SB2
SA
192
182
SC1
SB1
191
181
I'
I
SD
280
270
260
250
220
210
205
201
166
164
165
162
160
150
105
101
Z
Y
X

SEMICONDUCTOR DEVICES

CROSS-REFERENCE TO RELATED APPLICATION(S)

This application claims the benefit of priority under 35 U.S.C. 1119(a) of Korean Patent Application No. 10-2021-0088976, filed on Jul. 7, 2021, in the Korean Intellectual Property Office, the entire disclosure of which is incorporated herein by reference for all purposes.

BACKGROUND

The present inventive concept relates to a semiconductor device.

As demand for high performance, high speed, and/or multifunctionality in semiconductor devices increases, the degree of integration of semiconductor devices is increasing. According to the trend for high integration of semiconductor devices, the size of transistors is reduced, and the sizes of interconnection layers and vias electrically connected to the transistors having a reduced size are also reduced. Accordingly, various studies are being conducted to reduce the resistance of interconnection layers and vias and increase capacitance between the interconnection layers.

SUMMARY

Example embodiments provide a semiconductor device having improved electrical characteristics and reliability.

According to example embodiments, a semiconductor device includes a lower structure including a substrate; a first interconnection layer extending lengthwise in a first direction on the lower structure, and including a first metal; a first via contacting a portion of an upper surface of the first interconnection layer and including a second metal, different from the first metal; a second via contacting at least a portion of an upper surface of the first via and having a maximum width narrower than a maximum width of the first via; and a second interconnection layer connected to the second via and extending lengthwise in a second direction, perpendicular to the first direction. The first interconnection layer has inclined side surfaces in which a width of the first interconnection layer becomes narrower towards an upper region of the first interconnection layer, and the first via has inclined side surfaces in which a width of the first via becomes narrower towards an upper region of the first via.

According to example embodiments, a semiconductor device includes a plurality of first interconnection layers extending lengthwise in a first direction on a substrate, and spaced apart from each other in a second direction, perpendicular to the first direction; a plurality of second interconnection layers disposed on the plurality of first interconnection layers, extending lengthwise in the second direction, and spaced apart from each other in the first direction; and a plurality of via structures disposed in at least a portion of regions in which the plurality of first interconnection layers and the plurality of second interconnection layers intersect, on a level between the plurality of first interconnection layers and the plurality of second interconnection layers, the plurality of via structures electrically connecting the plurality of first interconnection layers and the plurality of second interconnection layers to each other. At least one of the plurality of first interconnection layers and the plurality of second interconnection layers has inclined side surfaces in which a width becomes wider towards a lower region of the at least one of the plurality of first interconnection layers and the plurality of second interconnection layers, each of the plurality of via structures includes a portion having inclined side surfaces in which a width becomes wider towards a lower region of each of the plurality of via structures, each of the plurality of first interconnection layers is formed of a first metal, each of the via structures includes a metal layer including a second metal, and the second metal is different from the first metal and is in contact with the first metal.

According to example embodiments, a semiconductor device includes a lower structure including a substrate; a plurality of first interconnection layers extending lengthwise on the lower structure in a first direction, and spaced apart from each other in a second direction, perpendicular to the first direction; a plurality of second interconnection layers disposed on the plurality of first interconnection layers, extending lengthwise in the second direction, and spaced apart from each other in the first direction; a first via in contact with a portion of an upper surface of one of the plurality of first interconnection layers; a second via disposed between the first via and one second interconnection layer among the plurality of second interconnection layers and in contact with the first via; a first interlayer insulating layer covering side surfaces of each of the plurality of first interconnection layers, the first via, and the second via; and a second interlayer insulating layer covering side surfaces of each of the plurality of second interconnection layers. In each of the plurality of first interconnection layers, a width of a lower region is greater than a width of an upper region, a width of a lower region of the first via is greater than a width of an upper region thereof, a width of a lower region of the second via is greater than a width of an upper region thereof; each of the plurality of first interconnection layers is formed of a first metal, the first via is formed of a second metal, and the second metal is different from the first metal.

BRIEF DESCRIPTION OF DRAWINGS

The above and other aspects, features, and advantages of the present inventive concept will be more clearly understood from the following detailed description, taken in conjunction with the accompanying drawings, in which like numerals refer to like elements throughout. In the drawings.

DETAILED DESCRIPTION

Hereinafter, example embodiments will be described with reference to the accompanying drawings.

Figure 1:
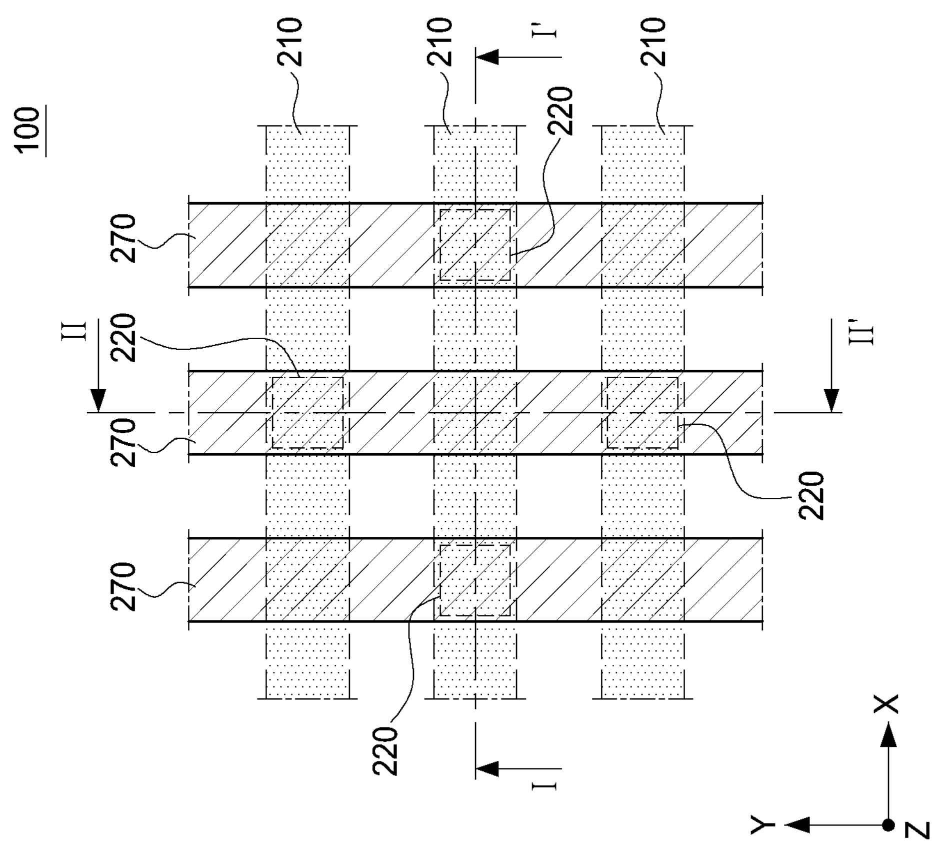
FIG. 1 is a plan view illustrating a semiconductor device, according to example embodiments.

FIG. 1 is a plan view illustrating a semiconductor device according to example embodiments.

Figure 2:
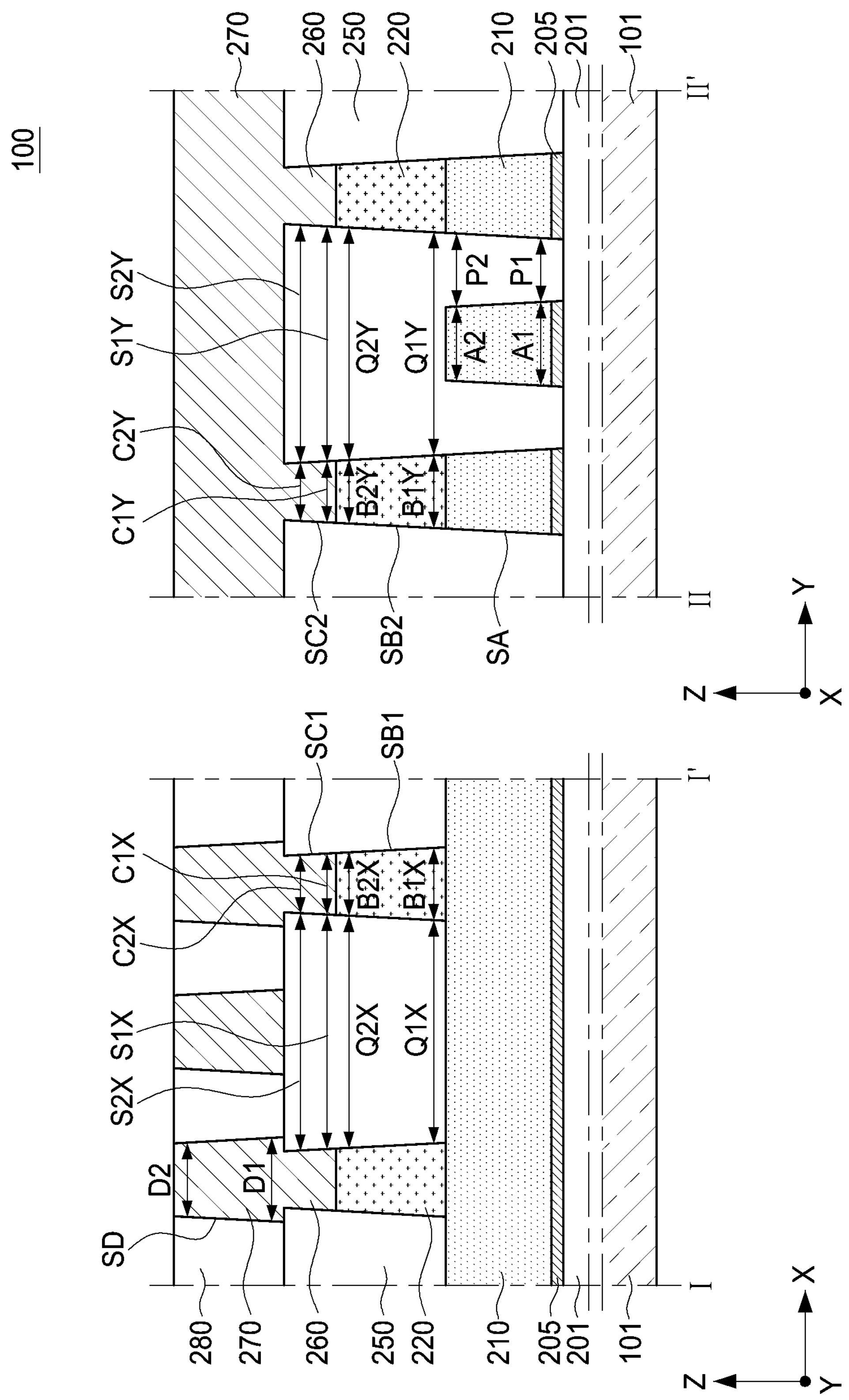
FIG. 2 is a cross-sectional view illustrating a semiconductor device, according to example embodiments.

FIG. 2 is a cross-sectional view illustrating a semiconductor device according to example embodiments. FIG. 2 illustrates cross-sections of the semiconductor device of FIG. 1 taken along lines I-I' and II-II'.

Referring to FIGS. 1 and 2, a semiconductor device 100 may include a lower structure including a substrate 101 and an insulating layer 201, a first interconnection layer 210 on the lower structure, a first via 220 on the first interconnection layer 210, a second via 260 on the first via 220, and a second interconnection layer 270 on the second via 260. The semiconductor device 100 may further include a first barrier layer 205, a first interlayer insulating layer 250, and a second interlayer insulating layer 280. The first barrier layer 205, the first interconnection layer 210, the first via 220, the second via 260, the first interlayer insulating layer 250, the second interconnection layer 270, and the second interlayer insulating layer 280 may constitute an upper structure.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like. Transistors constituting an integrated circuit may be disposed on the substrate 101, and the transistors may be disposed in a region between the substrate 101 and the insulating layer 201.

Transistors constituting the integrated circuit may include a planar Metal Oxide Semiconductor FET (MOSFET), a FinFET in which an active region has a fin structure (refer to FIG. 10), and a Gate-All-Around transistor or Multi Bridge Channel FET (MBCFET™) (refer to FIG. 11) including a plurality of channels stacked vertically on an active region, or a Vertical FET (VFET), but the configuration is not limited thereto. The integrated circuit may also include a volatile memory device such as DRAM and static RAM (SRAM), and a non-volatile memory device such as PRAM, MRAM, ReRAM, and a flash memory device.

The insulating layer 201 may be disposed on the substrate 101. The insulating layer 201 may be formed of silicon oxide or a layer of a low-k insulating material having a dielectric constant lower than that of silicon oxide. For example, the insulating layer 201 may include a low-k insulating material such as SiOCH or SiOC. For example, the insulating layer 201 may include a material, such as phosphor silicate glass (PSG), boro-phosphor silicate glass (BPSG), undoped silicate glass (USG), tetra ethyl ortho silicate (TEOS), or plasma enhanced-TEOS (PE-TEOS), high density plasma-chemical vapor deposition (HDP-CVD) oxide, or the like. The insulating layer 201 may include a plurality of insulating layers sequentially stacked on the substrate 101.

The first barrier layer 205 may be disposed between the insulating layer 201 and the first interconnection layer 210. The first barrier layer 205 may include at least one of, for example, titanium (Ti), titanium nitride (TiN), tantalum (Ta), tantalum nitride (TaN), tungsten nitride (WN), and tungsten carbon nitride (WCN). The first barrier layer 205 may include a two-dimensional material (2D material) that is a solid of a single-layer or half-layer in which atoms form a predetermined crystal structure. For example, the first barrier layer 205 may include at least one of graphene, tantalum sulfide (TaS), molybdenum sulfide (MoS), and tungsten sulfide (WS). The first barrier layer 205 may be provided between the insulating layer 201 and the first interconnection layer 210 to improve adhesion between the insulating layer 201 and the first interconnection layer 210. In some embodiments, the first barrier layer 205 may contact an upper surface of the insulating layer 201 and a lower surface of the first interconnection layer 210. As used herein, the term "contact" refers to a direct connection (i.e., touching) unless the context indicates otherwise.

The first interconnection layer 210 may be disposed on the insulating layer 201 of the lower structure, for example, on the upper surface of the first barrier layer 205. The first interconnection layer 210 may extend lengthwise in a first direction, for example, an X-direction. In a plan view, at least a portion of the first interconnection layer 210 may have a line shape. The first interconnection layer 210 may include a plurality of first interconnection layers 210 spaced apart from each other in a second direction, perpendicular to the first direction, for example, in a Y direction. The plurality of first interconnection layers 210 may extend lengthwise in parallel to one another. The X direction and the Y direction may be directions parallel to the upper surface of the substrate 101, respectively.

A width A1 of a lower region of the first interconnection layer 210 may be greater than a width A2 of an upper region of the first interconnection layer 210. The first interconnection layer 210 may have inclined side surfaces SA such that the first interconnection layer 210 becomes narrower in width in the Y direction towards an upper region of the first interconnection layer 210 (e.g., in the Z direction), and the first interconnection layer 210 may have a minimum width in the Y direction at the level of the upper surface. The first interconnection layer 210 may have the inclined side surfaces SA that increase in width in the Y direction towards a lower region of the first interconnection layer 210, and the first interconnection layer 210 may have a maximum width in the Y direction at the level of the lower surface. An angle between the lower surface and the side surface SA of the first interconnection layer 210 may be an acute angle, for example, less than 90°.

The first interconnection layer 210 may be formed by a method different from a damascene method in which an interlayer insulating layer is first formed and patterned, and then a metal layer is filled. For example, the first interconnection layer 210 may be formed by first depositing a metal layer and then performing a photo process and an etching process. Accordingly, the first interconnection layer 210 may have the same shape as described above. Since the first interconnection layer 210 is formed in plural, a separation distance P2 between upper regions of the plurality of first interconnection layers 210 adjacent to each other in the Y direction may be greater than a separation distance P1 between lower regions of the plurality of first interconnection layers 210 adjacent to each other in the Y direction.

The first interconnection layer 210 may include a first metal, for example, at least one of ruthenium (Ru), molybdenum (Mo), tungsten (W), copper (Cu), and cobalt (Co). In an example embodiment, the first metal may include an alloy of the metals. The first metal of the first interconnection layer 210 may be different from a second metal forming the first via 220. Accordingly, even when an etch stop layer is not formed between the first interconnection layer 210 and the first via 220 when the first via 220 is formed, an etch process of the first via 220 may be stopped due to a difference in etch selectivity between different metals, and damage or recessing of the upper region of the first interconnection layer 210 by etching may be significantly reduced. Compared to the case in which the etch stop layer is disposed between the first interconnection layer 210 and the first via 220, in the present inventive concept, the interfacial resistance between the etch stop layer and the metal layer is increased, and thus, the electrical characteristics and reliability of the semiconductor device may be improved.

The first via 220 may be disposed between the first interconnection layer 210 and the second interconnection layer 270. The first via 220 may be respectively disposed in at least some regions among regions in which the plurality of first interconnection layers 210 and the plurality of second interconnection layers 270 intersect, at a level between the first interconnection layers 210 and the second interconnection layer 270. The first via 220 may electrically connect the first interconnection layer 210 and the second interconnection layer 270 to each other. The first via 220 may contact a portion of the upper surface of the first interconnection layer 210 and may contact the second via 260. The first via 220 may have any one of a polygonal shape, a square shape, a rectangular shape, a rounded square shape, a circle, and an ellipse in a plan view. The first via 220 may be provided as a plurality of first vias 220 on each of the plurality of first interconnection layers 210, and the plurality of first vias 220 may be disposed to be spaced apart from each other on one first interconnection layer 210 in the X direction.

Widths B1X and B1Y of the lower region of the first via 220 may be greater than widths B2X and B2Y, respectively, of the upper region of the first via 220. The first via 220 may have inclined first side surfaces SB1 such that a width of the first via 220 in the X direction becomes narrower towards an upper region of the first via 220 (e.g., in the Z direction), and the first via 220 may have a minimum width in the X direction at the level of the upper surface of the first via 220. The first via 220 may have inclined first side surfaces SB1 in which a width of the first via 220 becomes wider towards a lower region of the first via 220 in the X direction, and the first via 220 may have a maximum width in the X direction at the level of the lower surface of the first via 220. The first via 220 may have inclined second side surfaces SB2 such that a width of the first via 220 in the Y direction becomes narrower towards an upper region of the first via 220 (e.g., in the Z direction), and the first via 220 may have a minimum width in the Y direction at the level of the upper surface of the first via 220. The first via 220 may have inclined second side surfaces SB2 such that a width of the first via 220 in the Y direction becomes narrower towards a lower region of the first via 220 (e.g., in the Z direction), and the first via 220 may have a maximum width in the Y direction at the level of the lower surface of the first via 220. An angle formed between the lower surface of the first via 220 and the first side surface SB1 and an angle formed between the lower surface of the first via 220 and the second side surface SB2 may be acute angles, respectively.

The first via 220 is formed by a metal etching process rather than a damascene method, and thus, may have the same shape as described above. Since the first via 220 is formed in plural, a separation distance Q2X between upper regions of the plurality of first vias 220 adjacent to each other in the X direction may be greater than a separation distance Q1X between the lower regions of the plurality of first vias 220 adjacent to each other in the X direction. Likewise, a separation distance Q2Y between upper regions of the plurality of first vias 220 adjacent to each other in the Y direction may be greater than a separation distance Q1Y between the lower regions of the plurality of first vias 220 adjacent to each other in the Y direction.

The first via 220 may include a second metal, for example, at least one of ruthenium (Ru), molybdenum (Mo), tungsten (W), copper (Cu), and cobalt (Co), and in this case, a material different from the first metal may be selected. For example, the second metal may include at least one material different from the first metal, among ruthenium (Ru), molybdenum (Mo), tungsten (W), copper (Cu), and cobalt (Co). In an example embodiment, the second metal may include an alloy of the metallic materials. The second metal of the first via 220 may directly contact the first metal of the first interconnection layer 210.

The second via 260 may be disposed on the first via 220, between the first interconnection layer 210 and the second interconnection layer 270. The second via 260 may be respectively disposed in at least some regions among regions in which the plurality of first interconnection layers 210 and the plurality of second interconnection layers 270 intersect, at a level between the first interconnection layers 210 and the second interconnection layer 270. The second via 260 may electrically connect the first interconnection layer 210 and the second interconnection layer 270 to each other. The second via 260 may contact at least a portion of an upper surface of the first via 220 and may be integrated with the second interconnection layer 270. The second via 260 may have any one of a polygonal shape, a square shape, a rectangular shape, and a rounded square shape in a plan view. The second via 260 may be provided as a plurality of second vias 260 to correspond to at least some of the plurality of first vias 220, respectively.

In the second via 260, widths C1X and C1Y of the lower region may be greater than widths C2X and C2Y, respectively, of the upper region. The second via 260 may have inclined first side surfaces SC1 such that a width of the second via 260 in the X direction becomes narrower towards an upper region of the second via 260 (e.g., in the Z direction). The second via 260 may have inclined first side surfaces SC1 such that a width of the second via 260 in the X direction becomes wider towards a lower region of the second via 260, and the second via 260 may have a maximum width in the X direction at the level of the lower surface of the second via 260. The second via 260 may have inclined second side surfaces SC2 such that a width of the second via 260 in the Y direction becomes narrower towards an upper region of the second via 260 (e.g., in the Z direction). The second via 260 may have inclined second side surfaces SC2 such that a width of the second via 260 in the Y direction becomes wider towards a lower region of the second via 260, and the second via 260 may have a maximum width in the Y direction at the level of the lower surface of the second via 260. The maximum width of the second via 260 may be less than the maximum width of the first via 220. An angle formed between the lower surface of the second via 260 and the first side surface SC1 and an angle formed between the lower surface of the second via 260 and the second side surface SC2 may be acute angles, respectively.

Since the second via 260 is formed in plural, a separation distance S2X between upper regions of the plurality of second vias 260 adjacent to each other in the X direction may be greater than a separation distance S1X between the lower regions of the plurality of second vias 260 adjacent to each other in the X direction. Likewise, a separation distance S2Y between upper regions of the plurality of second vias 260 adjacent to each other in the Y direction may be greater than a separation distance S1Y between the lower regions of the plurality of second vias 260 adjacent to each other in the Y direction.

The second via 260 may include a third metal, for example, at least one of ruthenium (Ru), molybdenum (Mo), tungsten (W), copper (Cu), and cobalt (Co). The third metal may be the same as or different from the first metal. The third metal may be the same as or different from the second metal. In an example embodiment, the third metal may include an alloy of the metallic materials.

The second via 260 may be formed by filling a conductive material layer in a region (refer to 'OP' in FIG. 16B) in which the mask pattern layer (refer to '232R' in FIG. 15B) on the first via 220 has been removed. The second via 260 may be self-aligned such that the side surfaces SC1 and SC2 may be substantially coplanar with the side surfaces SB1 and SB2 of the first via 220.

The second interconnection layer 270 may be disposed on the first interconnection layer 210. The second interconnection layer 270 may be connected to the second via 260 to be integrated therewith. For example, the second interconnection layer 270 and the second vias 260 may be a continuously integrated structure. As used herein, a "continuously integrated structure" refers to a structure that is continuously integrated, without a discontinuous boundary surface (for example, a grain boundary), in which two components formed by a different process are not simply in contact (discontinuity), but are formed of the same material by the same process. The second interconnection layer 270 may extend lengthwise in a second direction, for example, the Y direction. At least a portion of the second interconnection layer 270 may have a line shape in a plan view. The second interconnection layer 270 may include a plurality of second interconnection layers 270 spaced apart from each other in the first direction, for example, the X direction.

A width D1 of the lower region of the second interconnection layer 270 may be greater than a width D2 of the upper region of the second interconnection layer 270. The second interconnection layer 270 may have inclined side surfaces SD in which a width becomes narrower in the X direction towards an upper region of the second interconnection layer 270 (e.g., in the Z direction), and the second interconnection layer 270 may have a minimum width in the X direction at the level of the upper surface of the second interconnection layer 270. The second interconnection layer 270 may have inclined side surfaces SD such that a width of the second interconnection layer 270 in the X direction increases towards a lower region of the second interconnection layer 270. An angle between the upper surface and the side surface SD of the second interconnection layer 270 may be an obtuse angle, for example, more than 90°.

The second interconnection layer 270 is formed by a metal etching process rather than a damascene method, and may thus have the same shape as described above. However, as illustrated in other drawings of the present specification, the second interconnection layer 270 may be formed by a damascene method, which will be described later with reference to FIGS. 6A and 6B. Since the second interconnection layer 270 is formed in plural, the separation distance between the upper regions of the plurality of second interconnection layers 270 adjacent to each other in the X direction may be greater than the separation distance between the lower regions of the plurality of second interconnection layers 270 adjacent to each other in the X direction.

The second interconnection layer 270 may include a third metal, for example, at least one of ruthenium (Ru), molybdenum (Mo), tungsten (W), copper (Cu), and cobalt (Co). The third metal may be the same as or different from the first metal. The third metal may be the same as or different from the second metal. In an example embodiment, the third metal may include an alloy of the metallic materials.

The first interlayer insulating layer 250 may be disposed on the lower structure. The first interlayer insulating layer 250 may cover side surfaces of each of the plurality of first interconnection layers 210, the plurality of first vias 220, and the plurality of second vias 260. The first interlayer insulating layer 250 may cover a portion of the upper surface of the first interconnection layer 210 not in contact with the first via 220. For example, the first interlayer insulating layer 250 may contact side surfaces of each of the plurality of first interconnection layers 210, the plurality of first vias 220, and the plurality of second vias 260, and the portion of the upper surface of the first interconnection layer 210. An upper surface of the first interlayer insulating layer 250 may be positioned on a higher level than an upper surface of the first via 220.

The second interlayer insulating layer 280 may cover side surfaces of each of the plurality of second interconnection layers 270. The second interlayer insulating layer 280 is disposed on the first interlayer insulating layer 250 and may cover the first interlayer insulating layer 250. For example, the second interlayer insulating layer 280 may contact side surfaces of each of the plurality of second interconnection layers 270 and an upper surface of the first interlayer insulating layer 250.

The first and second interlayer insulating layers 250 and 280 may constitute interlayer insulating layers in a region in which back end of line (BEOL) interconnection layers are disposed. Each of the first and second interlayer insulating layers 250 and 280 may be formed of silicon oxide or a layer of a low-k insulating material having a dielectric constant lower than that of silicon oxide. For example, the first and second interlayer insulating layers 250 and 280 may each include a low-k insulating material such as SiOCH or SiOC. For example, the first and second interlayer insulating layers 250 and 280 may include a material such as phosphor silicate glass (PSG), boro-phosphor silicate glass (BPSG), undoped silicate glass (USG), tetra ethyl ortho silicate (TEOS), and plasma enhanced-TEOS (PE-TEOS), high density plasma-chemical vapor deposition (HDP-CVD) oxide, or the like.

Figure 3A:
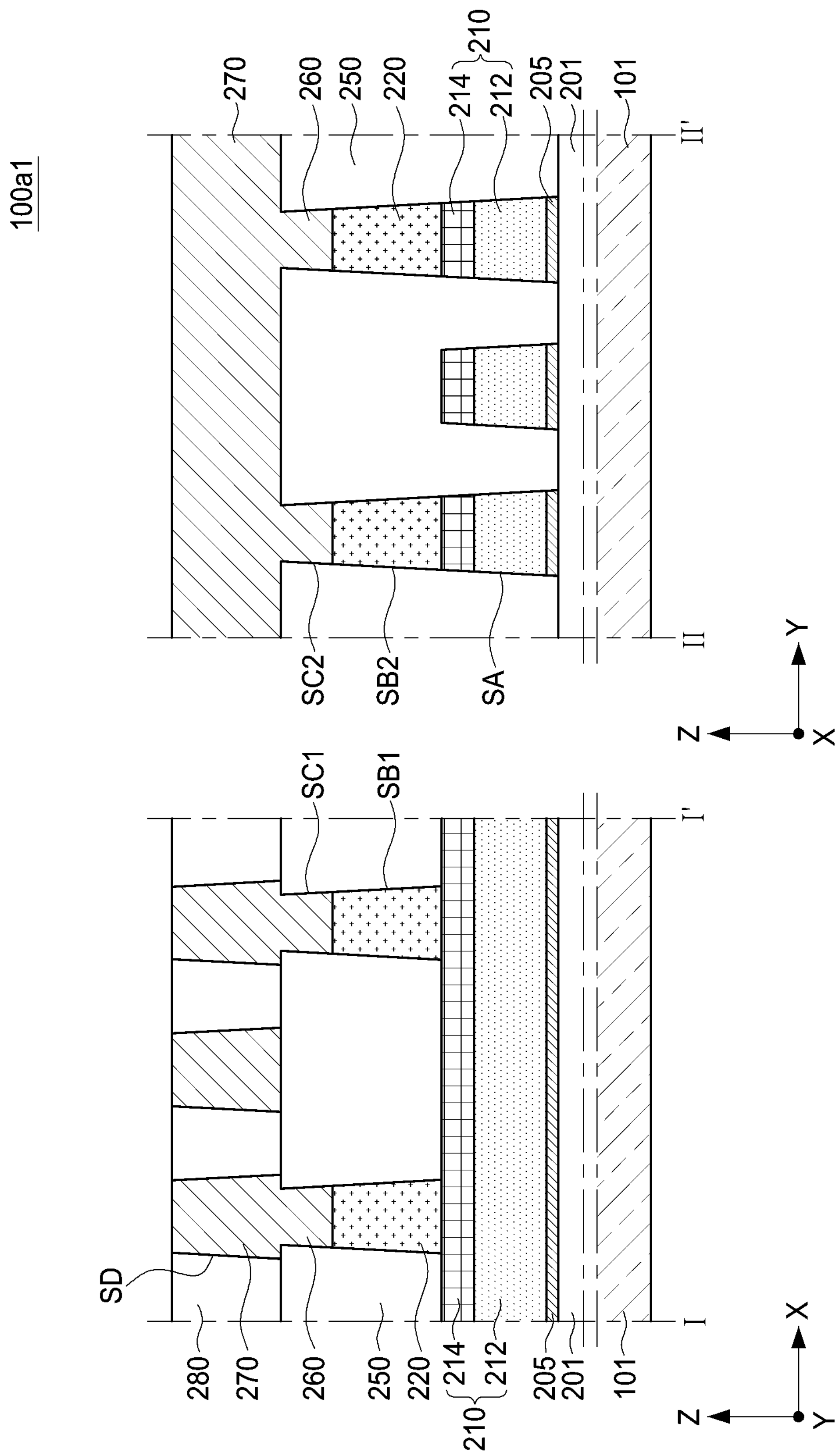
FIGS. 3A and 3B are cross-sectional views illustrating semiconductor devices, according to example embodiments.
Figure 3B:
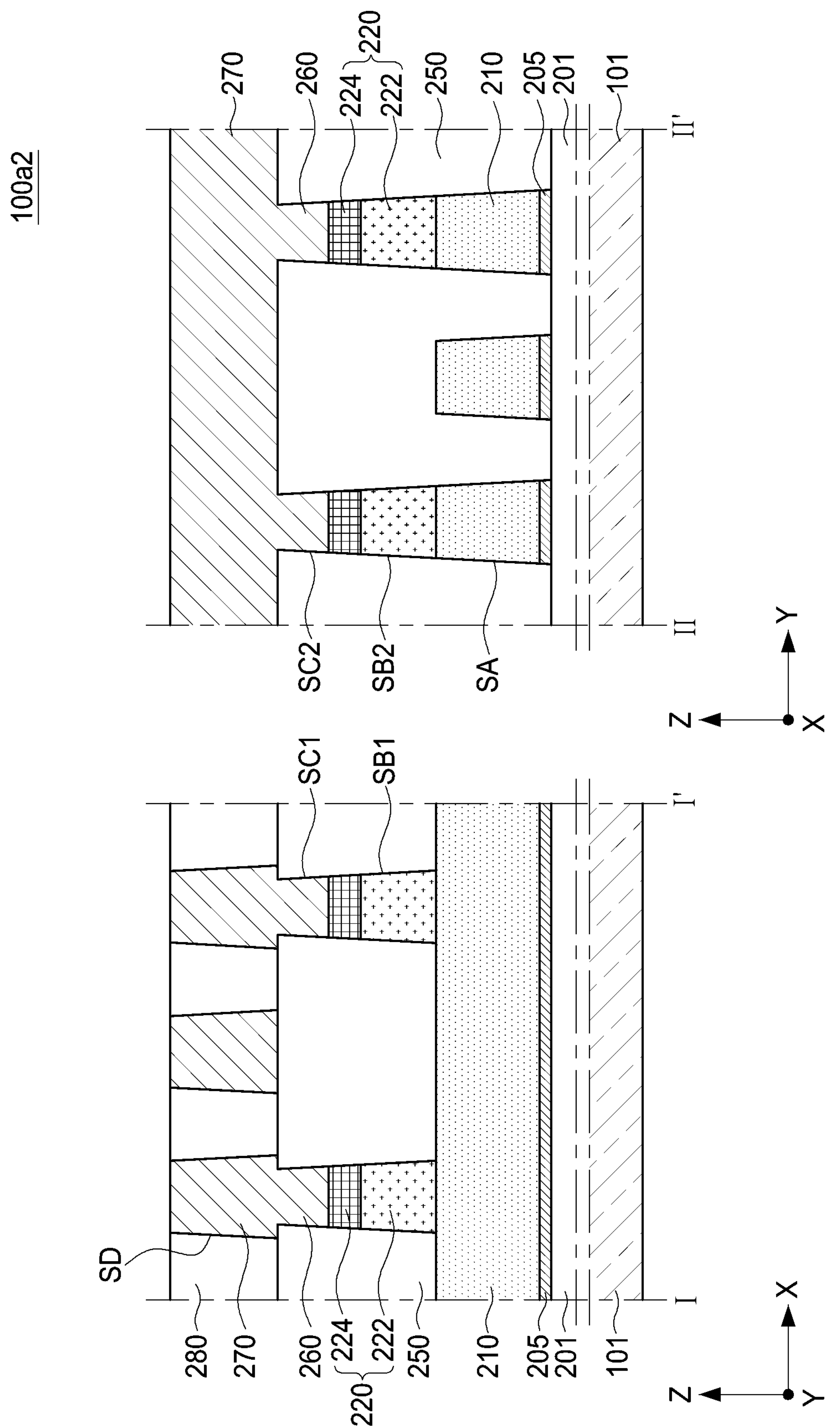

FIGS. 3A and 3B are cross-sectional views illustrating semiconductor devices according to example embodiments. FIGS. 3A and 3B respectively illustrate regions corresponding to those of FIG. 2.

Referring to FIG. 3A, in a semiconductor device 100_a_1, each of a plurality of first interconnection layers 210 may include a first conductive layer 212 and a second conductive layer 214 on the first conductive layer 212. A bottom surface of the second conductive layer 214 may contact an upper surface of the first conductive layer 212. The first via 220 may contact a portion of the upper surface of the second conductive layer 214. The first conductive layer 212 may include the first metal, and the second conductive layer 214 may include at least one material different from the first metal of the first conductive layer 212 and the second metal of the first via 220, among ruthenium (Ru), molybdenum (Mo), tungsten (W), copper (Cu), and cobalt (Co). In an example embodiment, each of the first conductive layer 212, the second conductive layer 214, and the first via 220 may include a different metal, respectively.

Referring to FIG. 3B, in a semiconductor device 100*a*2, each of the plurality of first vias 220 may include a first via pattern 222 and a second via pattern 224 on the first via pattern 222. A bottom surface of the second via pattern 224 may contact an upper surface of the first via pattern 222. The second via 260 may contact at least a portion of the upper surface of the second via pattern 224. The first via pattern 222 may include the second metal, and the second via pattern 224 may include at least one material different from the first metal of the first interconnection layer 210 and the second metal of the first via pattern 222, among ruthenium (Ru), molybdenum (Mo), tungsten (W), copper (Cu), and cobalt (Co). In an example embodiment, each of the first interconnection layer 210, the first via pattern 222, and the second via pattern 224 may respectively include different metals.

Figure 4A:
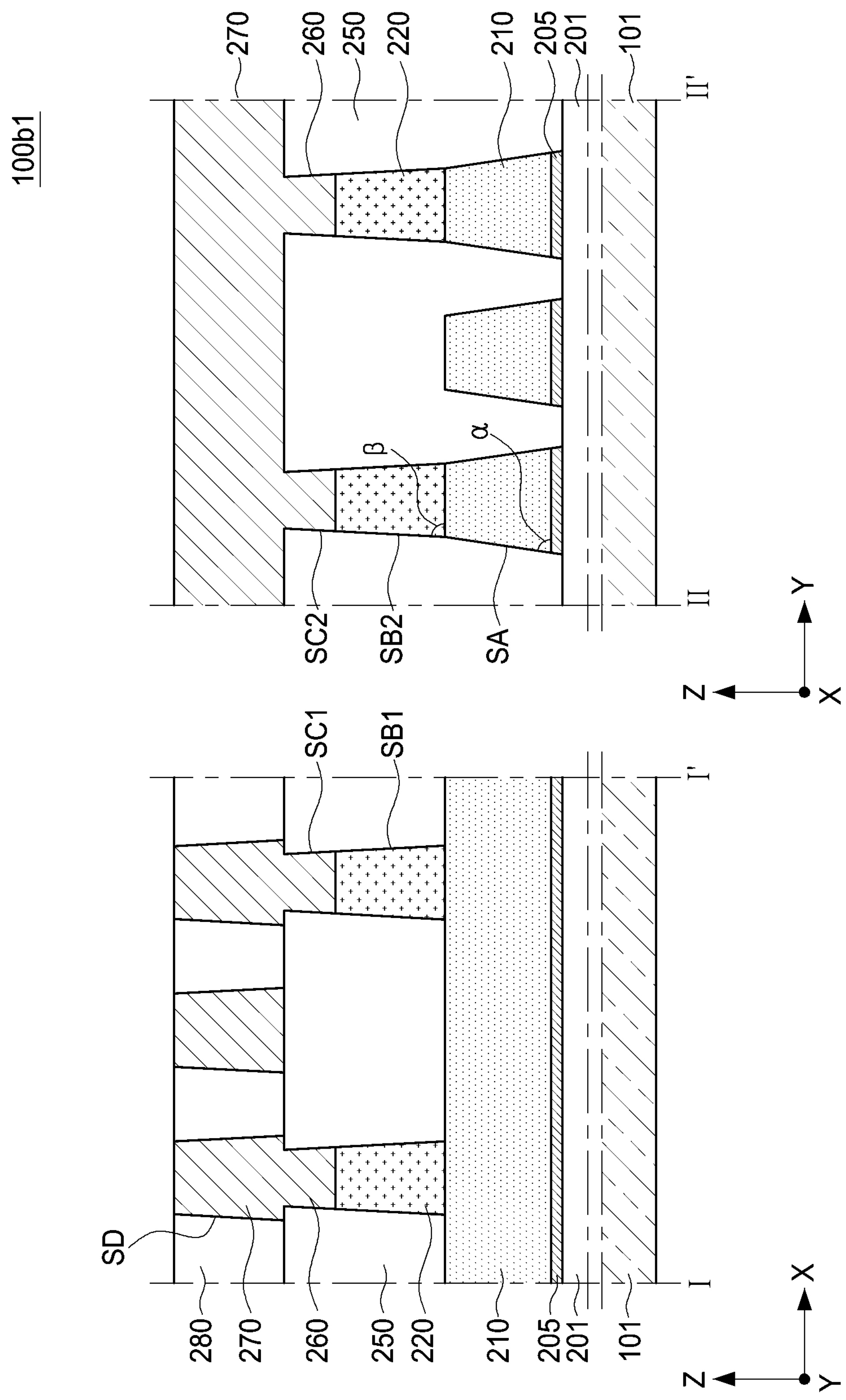
FIGS. 4A to 4C are cross-sectional views illustrating semiconductor devices, according to example embodiments.
Figure 4B:
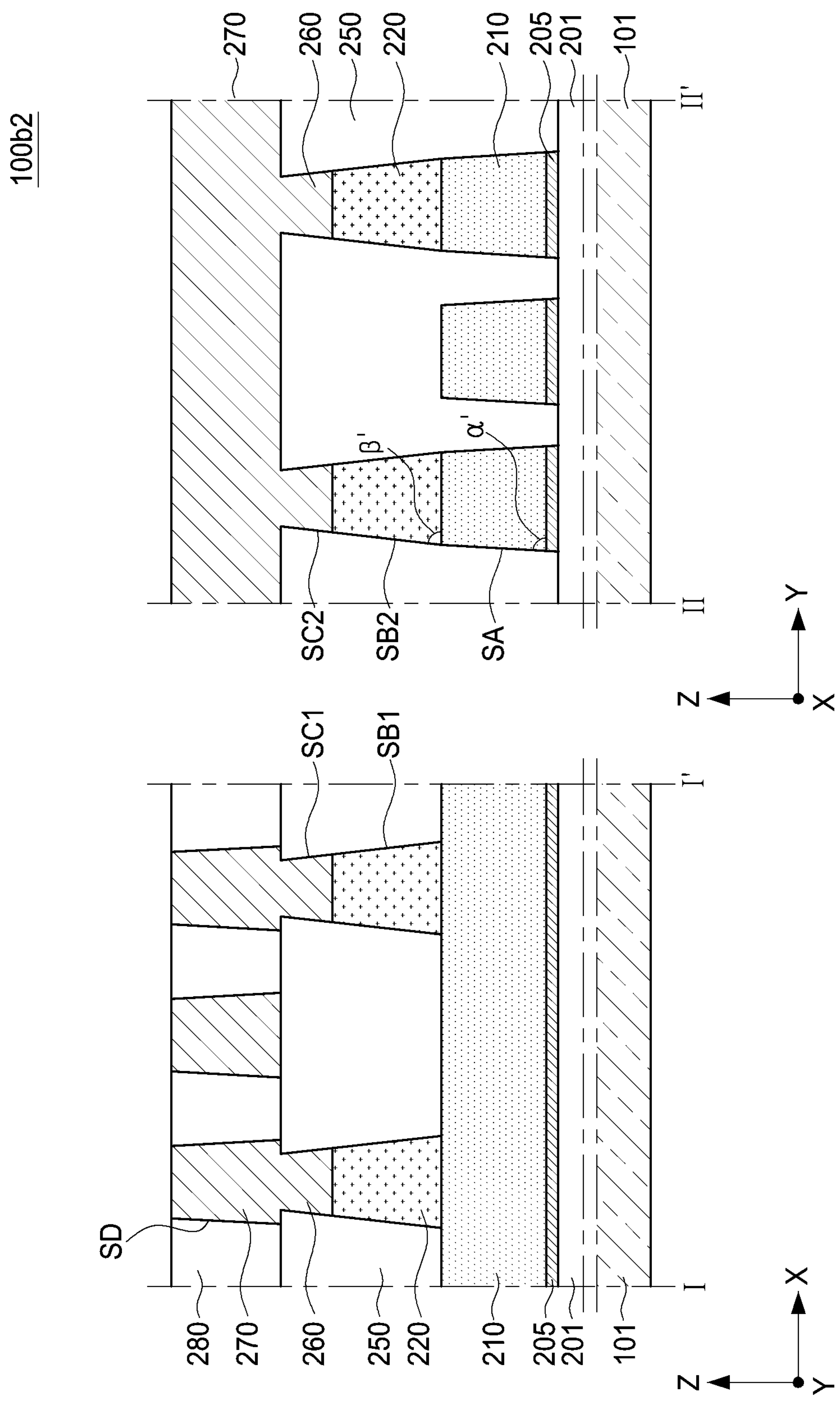
Figure 4C:
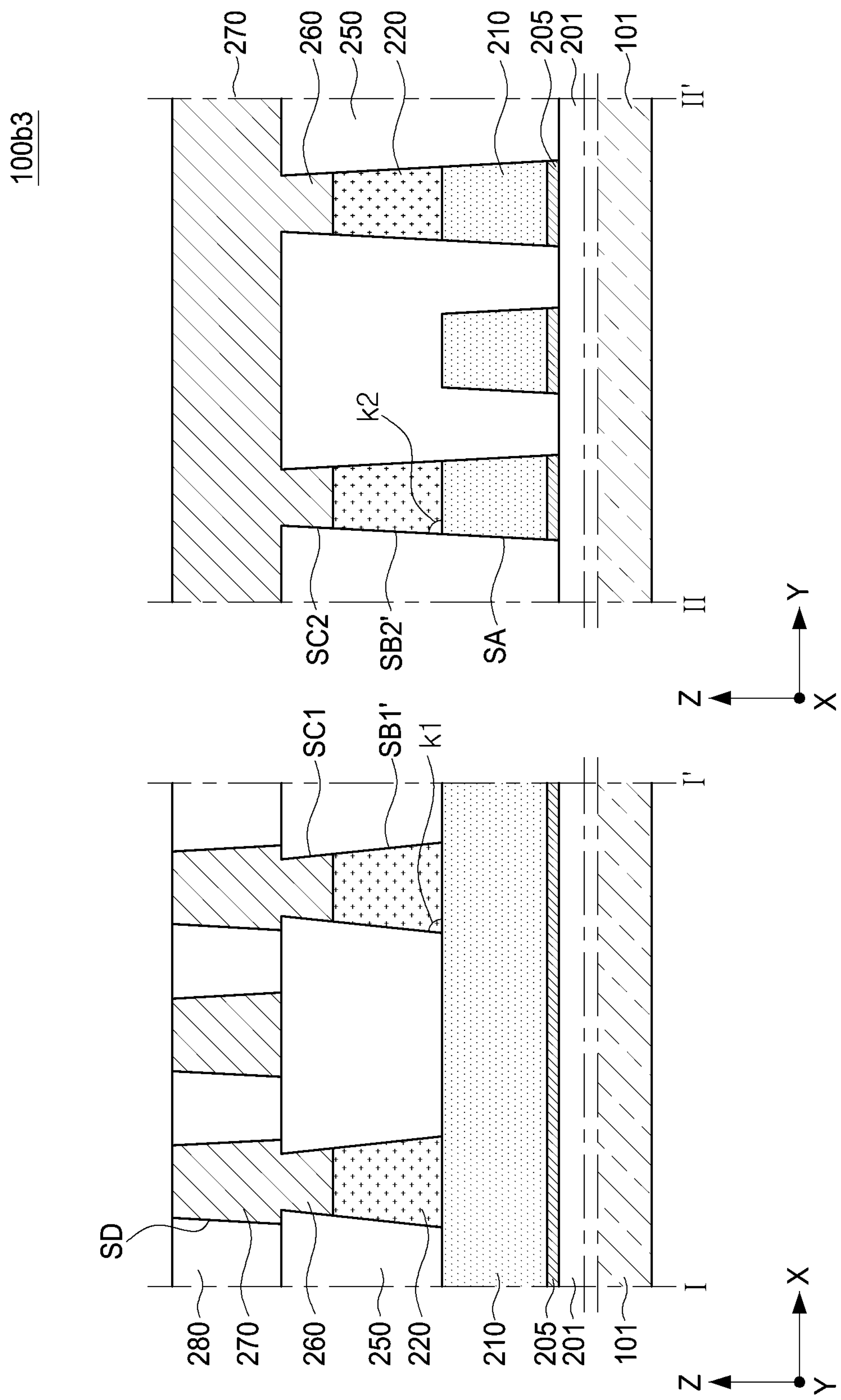

FIGS. 4A to 4C are cross-sectional views illustrating semiconductor devices according to example embodiments. FIGS. 4A to 4C respectively illustrate regions corresponding to those of FIG. 2.

Referring to FIG. 4A, in a semiconductor device 100*b*1, side surfaces SA of a first interconnection layer 210 may have a slope gentler than that of side surfaces SB1 and SB2 of a first via 220 with respect to the upper surface of the substrate 101. For example, at least one of the side surfaces SA of the first interconnection layer 210 forms an inclination of a first angle α with the lower surface of the first interconnection layer 210, and at least one of the side surfaces SB1 and SB2 of the first via 220 may form an inclination of a second angle β with the lower surface of the first via 220, and the first angle α and the second angle β may be different from each other. For example, the first angle α may be smaller than the second angle β.

Referring to FIG. 4B, in a semiconductor device 100*b*2, with respect to the upper surface of the substrate 101, the side surfaces SB1 and SB2 of the first via 220 may have a gentler slope than the side surfaces SA of the first interconnection layer 210. For example, at least one of the side surfaces SA of the first interconnection layer 210 forms an inclination of a first angle α' with the lower surface of the first interconnection layer 210, at least one of the side surfaces SB1 and SB2 of the first via 220 forms an inclination of a second angle β' with the lower surface of the first via 220, and the first angle α' and the second angle β' may be different from each other. For example, the first angle α' may be greater than the second angle β'.

Referring to FIG. 4C, in a semiconductor device 100*b*3, side surfaces SB1' and SB2' of the first via 220 may have different inclinations with respect to the upper surface of the substrate 101. For example, the first side surfaces SB1' of the first via 220 are inclined at a first angle k1 with the lower surface of the first via 220, and the second side surfaces SB2' of the second via 220 are inclined at a second angle k2 with the lower surface of the first via 220, and the first angle k1 and the second angle k2 may be different from each other. For example, the first angle k1 may be less than the second angle k2. However, according to example embodiments, the first angle k1 may be greater than the second angle k2.

Figure 5:
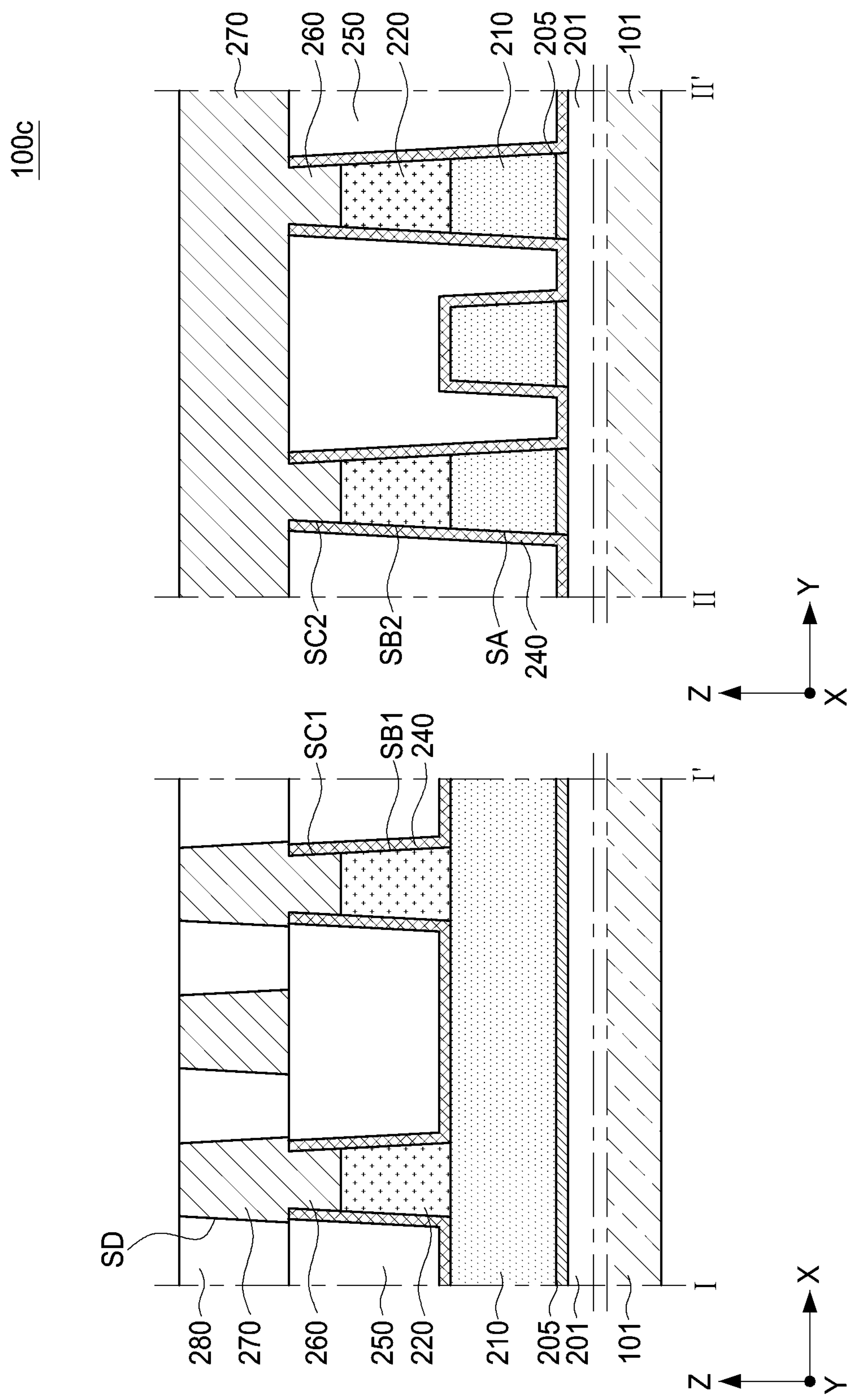
FIG. 5 is a cross-sectional view illustrating a semiconductor device, according to example embodiments.

FIG. 5 is a cross-sectional view illustrating a semiconductor device according to example embodiments. FIG. 5 illustrates regions corresponding to those of FIG. 2.

Referring to FIG. 5, a semiconductor device 100*c* may further include a second barrier layer 240. The second barrier layer 240 is disposed on the insulating layer 201, and may substantially conformally cover side surfaces SA of the plurality of first interconnection layers 210, and side surfaces SB1 and SB2 of the plurality of first vias 220, and side surfaces SC1 and SC2 of the plurality of second vias 260. The second barrier layer 240 may cover a portion of the upper surface of the first interconnection layer 210 that does not contact the first via 220. The first interlayer insulating layer 250 may cover the second barrier layer 240. For example, the second barrier layer 240 may contact the side surfaces SA of the plurality of first interconnection layers 210, the side surfaces SB1 and SB2 of the plurality of first vias 220, the side surfaces SC1 and SC2 of the plurality of second vias 260, a portion of the upper surface of the first interconnection layer 210, and the second barrier layer 240. The second barrier layer 240 may include at least one of, for example, titanium (Ti), titanium nitride (TiN), tantalum (Ta), tantalum nitride (TaN), tungsten nitride (WN), and tungsten carbon nitride (WCN). The second barrier layer 240 may include at least one of a two-dimensional (2D) material, for example, at least one of graphene, tantalum sulfide (TaS), molybdenum sulfide (MoS), and tungsten sulfide (WS). The second barrier layer 240 is formed between the first interlayer insulating layer 250 and the first interconnection layer 210, between the first interlayer insulating layer 250 and the first via 220, and the first interlayer insulating layer 250 and the second via 260, to improve adhesion to the first interlayer insulating layer 250. The second barrier layer 240 may also be applied to other embodiments of the present specification.

Figure 6A:
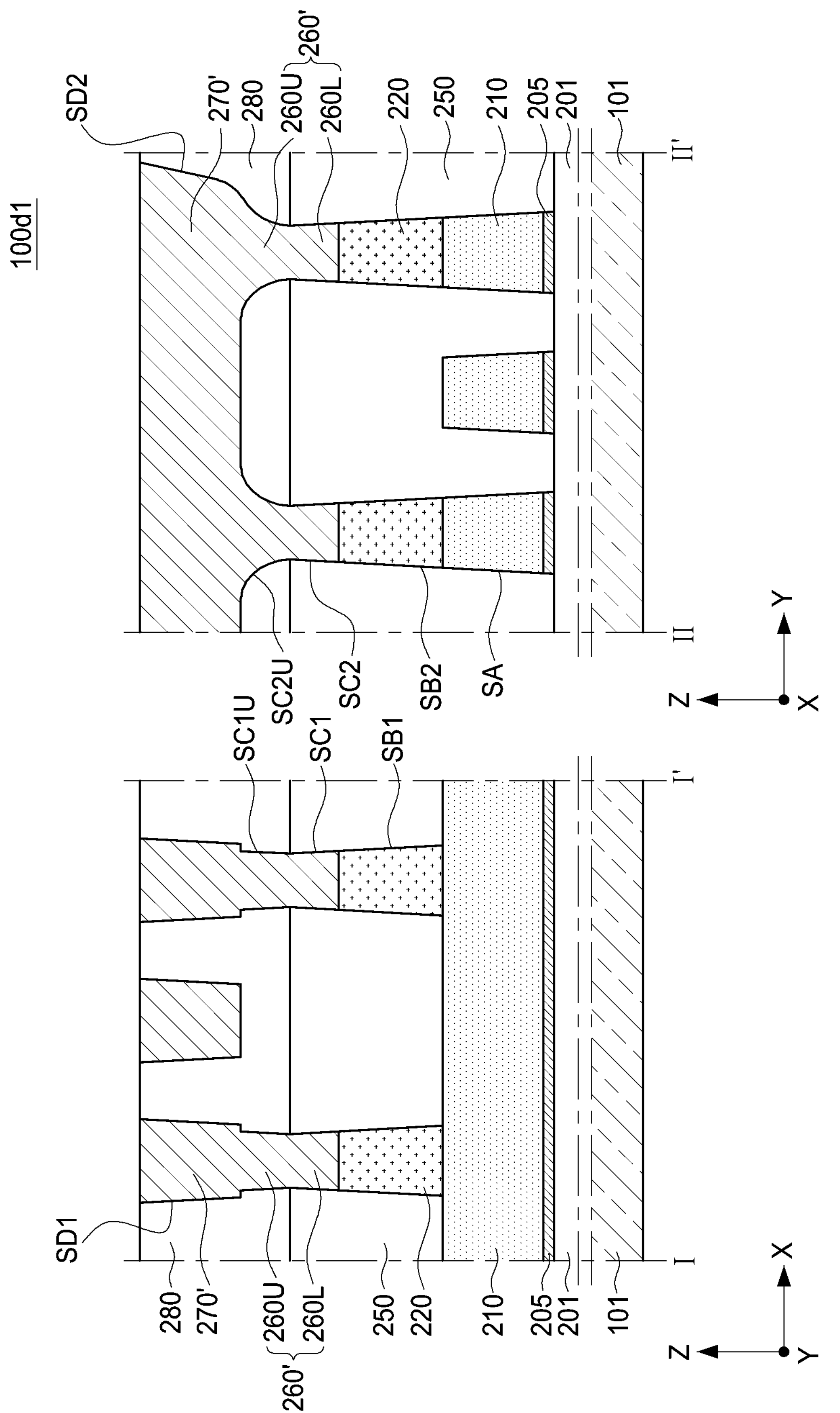
FIGS. 6A and 6B are cross-sectional views illustrating semiconductor devices, according to example embodiments.
Figure 6B:
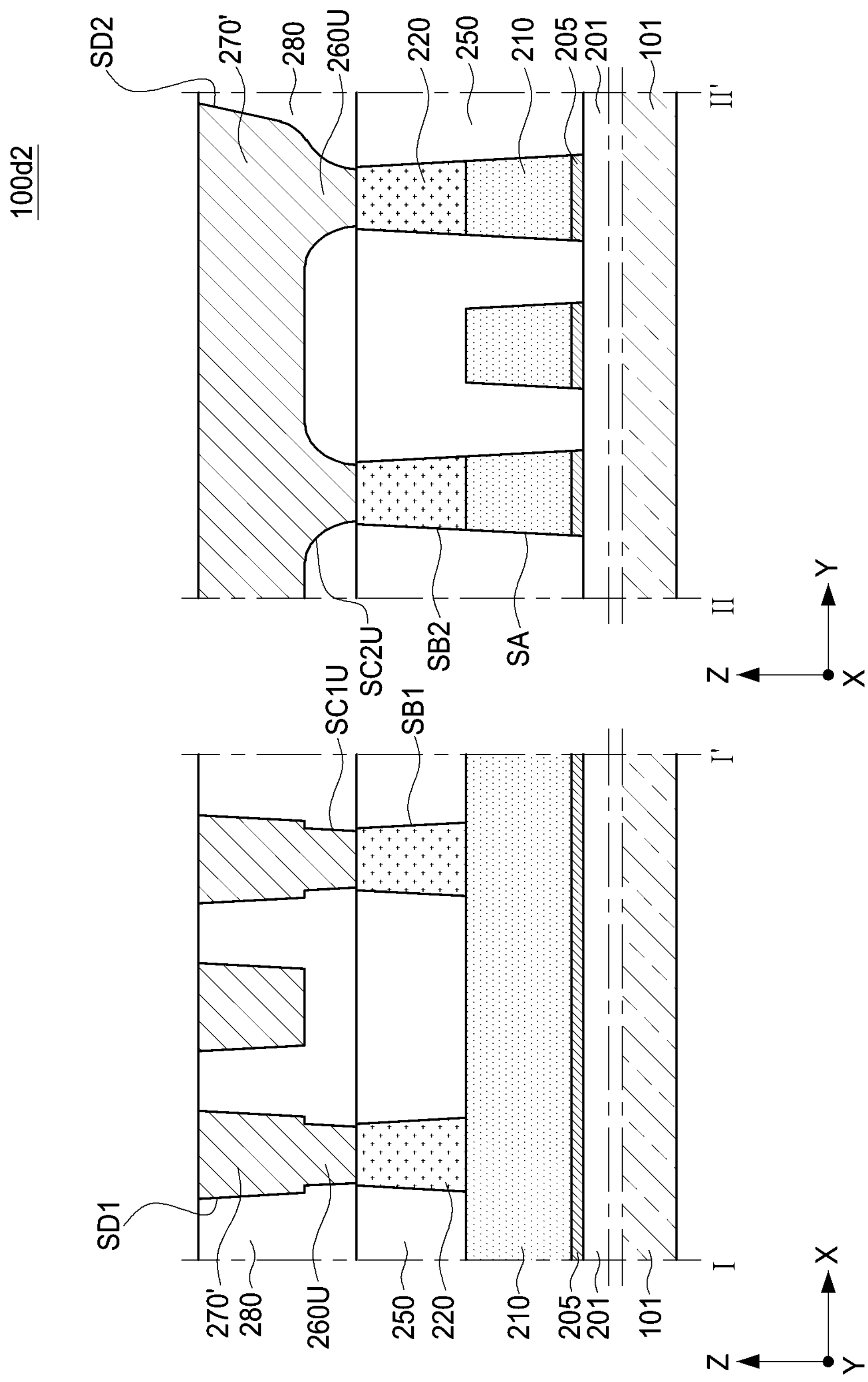

FIGS. 6A and 6B are cross-sectional views illustrating semiconductor devices according to example embodiments. FIGS. 6A and 6B illustrate regions corresponding to those of FIG. 2, respectively.

Referring to FIG. 6A, in a semiconductor device 100*d*1, each of a plurality of second vias 260' may include a first portion 260U and a second portion 260L. The second portion 260L may be disposed between the first portion 260U and the first via 220. The first portion 260U of the second via 260' may have inclined side surfaces SC1U and SC2U in which a width of the second via 260' becomes wider towards an upper region of the second via 260'. The second portion 260L of the second via 260' may have inclined side surfaces SC1 and SC2 in which a width of the second via 260' becomes wider towards a lower region of the second via 260'. The second portion 260L of the second via 260' may be formed by filling a conductive material in a region (refer to 'OP' in FIG. 16B) from which the mask pattern layer (refer to '232R' in FIG. 15B) on the first via 220 has been removed. The first portion 260U of the second via 260' may be formed by first forming a second interlayer insulating layer 280, patterning the second interlayer insulating layer 280 to form a via hole (refer to 'VH' in FIG. 18B) exposing the mask pattern layer, and then filling the via hole with a conductive material layer. This will be further described with reference to FIGS. 18A and 18B.

A plurality of second interconnection layers 270' may have inclined side surfaces SD1 in which a width of the second interconnection layers 270' in the X direction becomes wider towards an upper region of the second interconnection layers 270'. A side surface SD2 of an end portion of the plurality of second interconnection layers 270' in the Y direction may also be inclined such that the width thereof becomes wider towards an upper region of the second interconnection layers 270'.

Referring to FIG. 6B, in a semiconductor device **100*d*2, as compared to the semiconductor device 100*d*1 of FIG. 6A, the second portion 260L of the second via 260 is omitted, and the first portion 260U may be directly connected to the first via 220. In this embodiment, before forming the second interlayer insulating layer 280, in a state in which the mask pattern layer (refer to '232R' in FIG. 15B) has been already removed, the via hole exposing the first via 220 is formed, and then, the via hole is filled with a conductive material layer, thereby manufacturing the second interlayer insulating layer 280**.

Figure 7:
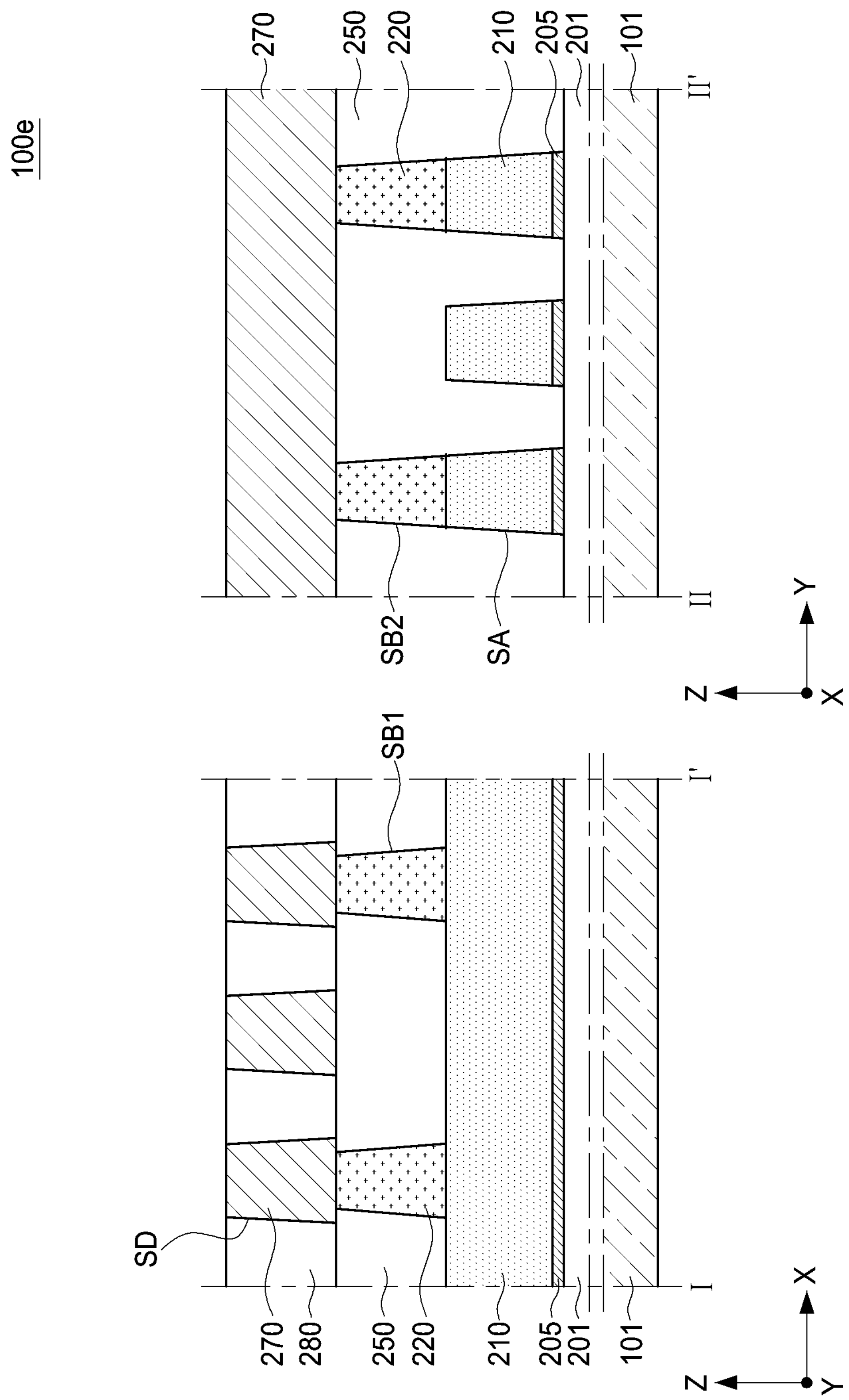
FIG. 7 is a cross-sectional view illustrating a semiconductor device, according to example embodiments.

FIG. 7 is a cross-sectional view illustrating a semiconductor device according to example embodiments. FIG. 7 illustrates regions corresponding to those illustrated in FIG. 2.

Referring to FIG. 7, in a semiconductor device **100*e*, as compared to the semiconductor device 100 of FIG. 2, the second via 260 is omitted and the second interconnection layers 270 may be directly connected to the first via 220 to contact the first via 220. In this embodiment, a metal layer is formed on the first via 220 in a state in which the mask pattern layer (please refer to '232' in FIG. 15B) has been removed by the planarization process and the etching process, and the metal layer is etched and the second interconnection layers 270 are formed, thereby manufacturing the semiconductor device 100*e***.

Figure 8:
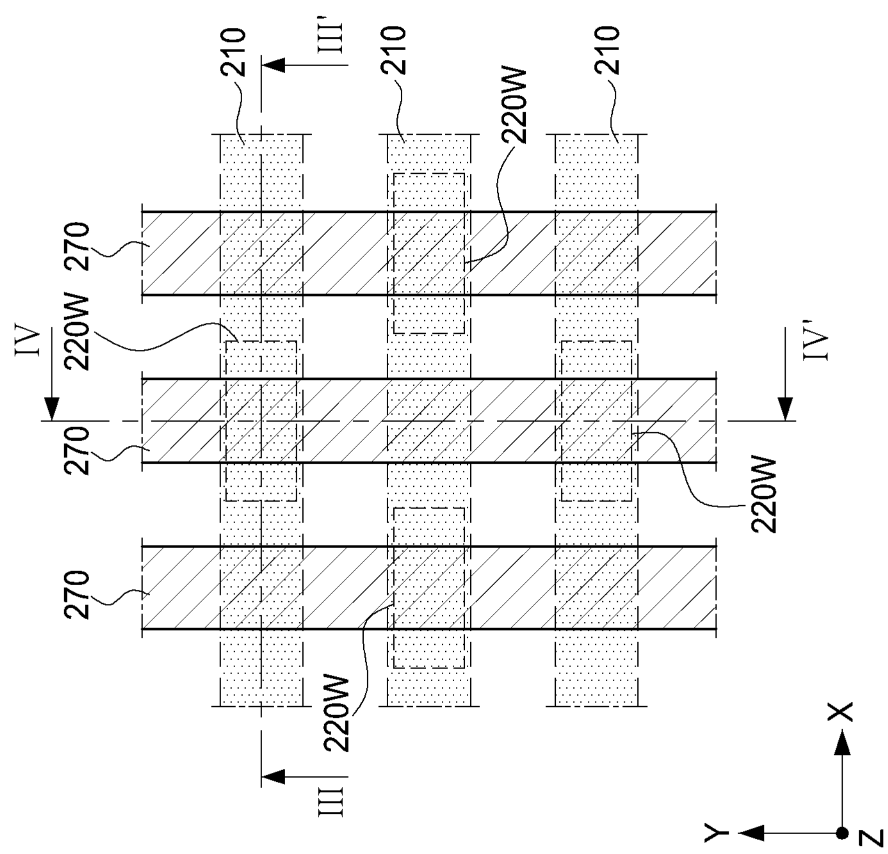
FIG. 8 is a plan view illustrating a semiconductor device, according to example embodiments.

FIG. 8 is a plan view illustrating a semiconductor device according to example embodiments.

Figure 9A:
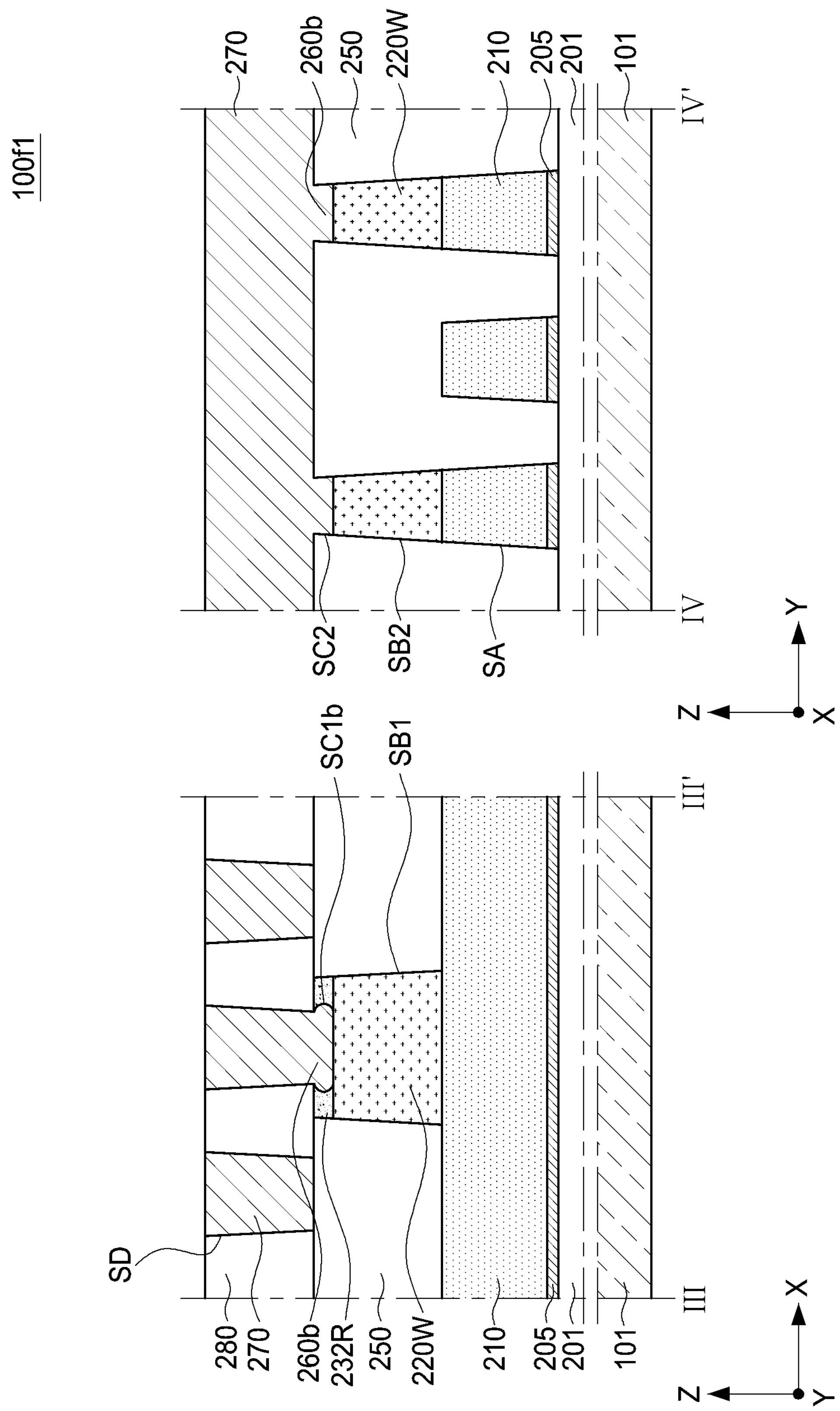
FIGS. 9A and 9B are cross-sectional views illustrating semiconductor devices, according to example embodiments.
Figure 9B:
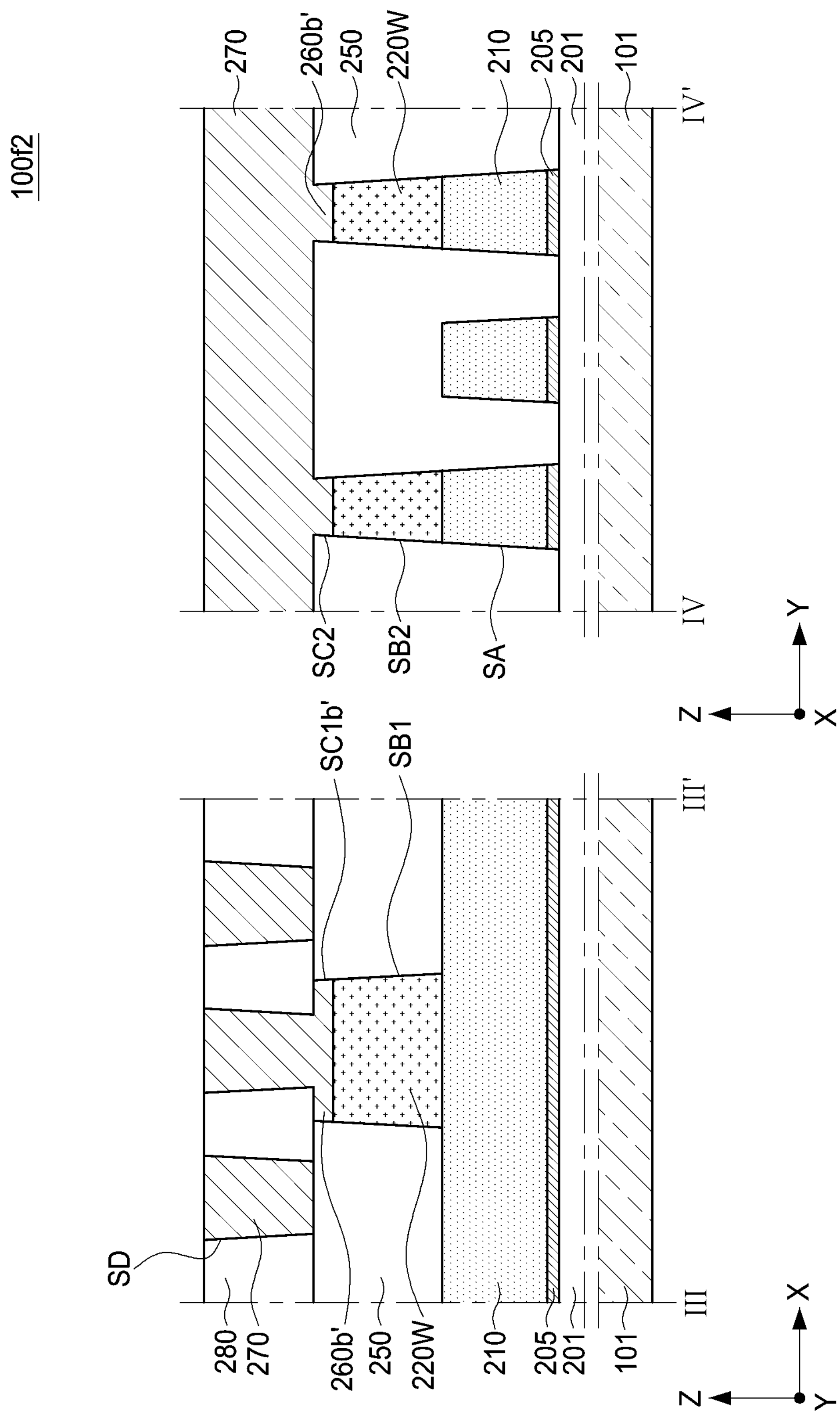

FIGS. 9A and 9B are cross-sectional views illustrating semiconductor devices according to example embodiments. FIG. 9A illustrates cross-sections of the semiconductor device of FIG. 8 taken along lines III-III' and IV-IV'. FIG. 9B illustrates cross-sections of the semiconductor device of FIG. 8, taken along lines and IV-IV'.

Referring to FIGS. 8 and 9A, in a semiconductor device **100*f*1, a first via 220W may have a first width in the X direction greater than a second width in the Y direction, and the semiconductor device 100*f*1 may further include a mask pattern layer 232R on the first via 220W. The mask pattern layer 232R may contact a side surface SC1*b* of a second via 260*b* and may contact a portion of the upper surface of the first via 220W. The side surface SC1*b* of the second via 260*b* may further protrude in a horizontal direction than the side surfaces SD of the second interconnection layer 270. For example, a width of the second via 260*b* in the X direction may be greater than a width of the second interconnection layer 270 in the X direction. The mask pattern layer 232**R may include at least one of TiO, TiN, TiON, AlO, AlN, AlOC, SiO, SiN, SiON, SiCN, WCN, and WN.

Referring to FIGS. 8 and 9B, in a semiconductor device **100*f*2, as compared to the semiconductor device 100*f*1 of FIG. 9A, the mask pattern layer 232R is completely removed, such that the second via 260*b*' has a structure in which side surfaces SC1*b*' are further expanded in the horizontal direction. For example, a width of the second via 260*b*' in the X direction may be greater than a width of the second interconnection layer 270** in the X direction.

A method of manufacturing semiconductor devices in the example embodiments of FIGS. 8, 9A, and 9B will be further described with reference to FIGS. 19A and 19B.

Figure 10:
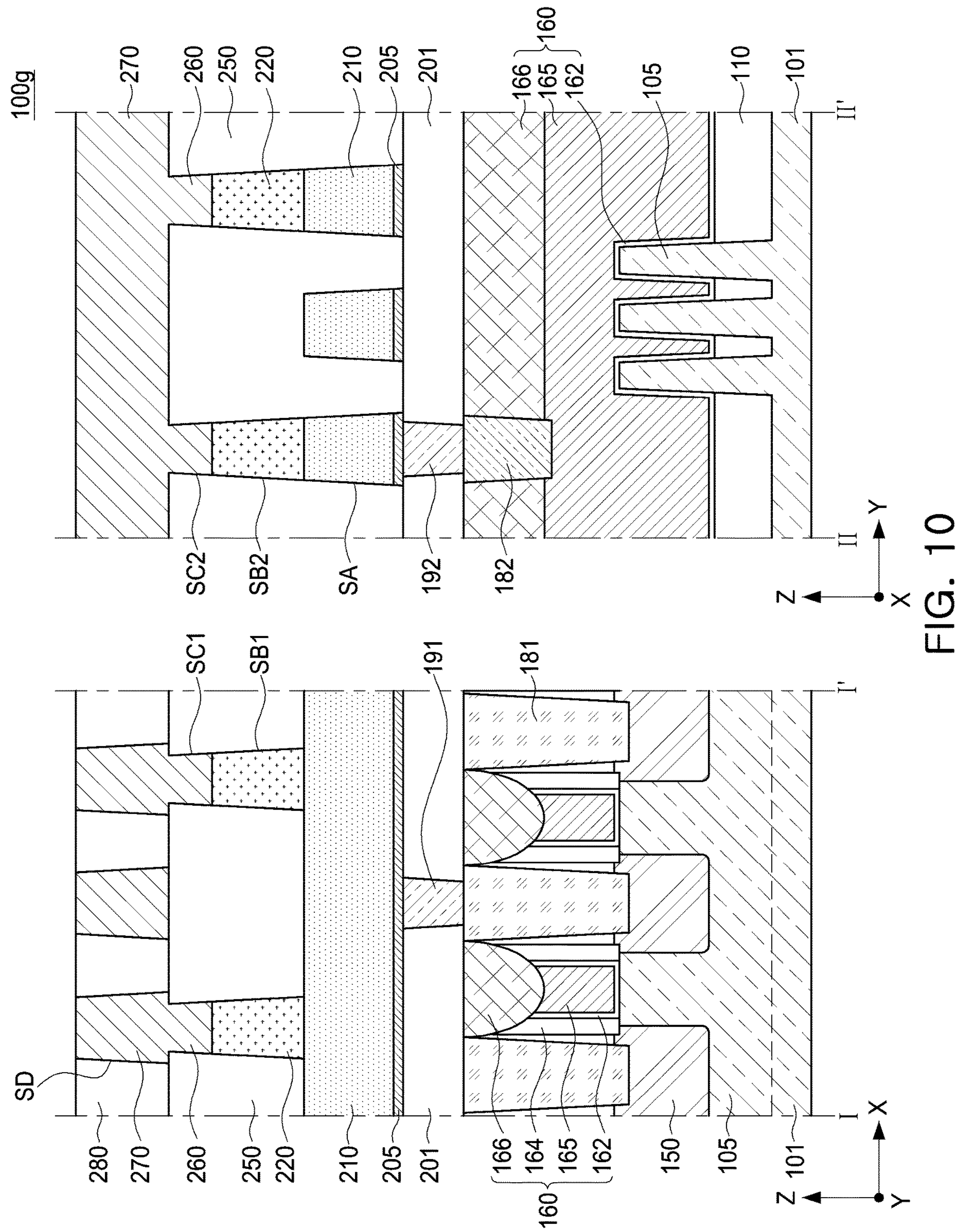
FIG. 10 is a cross-sectional view illustrating a semiconductor device, according to example embodiments.

FIG. 10 is a cross-sectional view illustrating a semiconductor device according to example embodiments. FIG. 10 illustrates regions corresponding to those of FIG. 2 and illustrates components constituting the lower structure together.

The lower structure of a semiconductor device **100*g* may include a transistor that includes an active region 105 on a substrate 101, a gate structure 160 extending to intersect the active region 105, and source/drain regions 150 disposed on the active region 105, on both sides of the gate structure 160. The lower structure may further include a device isolation layer 110, contact structures 181 and 182, and lower vias 191 and 192. The insulating layer 201 may be disposed between the transistor and the first interconnection layer 210**.

The active region 105 is defined by the device isolation layer 110 in the substrate 101 and may be disposed to extend lengthwise in the X-direction, for example. The active region 105 may include impurities, and at least portions of the active regions 105 may include impurities of different conductivity types, but the present inventive concept is not limited thereto. In an example embodiment, the active region 105 may have a fin structure protruding from the substrate 101, and the transistor may be a FinFET.

The device isolation layer 110 may define the active region 105 in the substrate 101. The device isolation layer 110 may be formed by, for example, a shallow trench isolation (STI) process. The device isolation layer 110 may be formed of an insulating material.

The source/drain regions 150 may serve as a source region or a drain region of the transistor. The source/drain regions 150 may be disposed on both sides of the gate structure 160. The source/drain regions 150 may include a semiconductor layer including silicon (Si) and may include an epitaxial layer. The source/drain regions 150 may include impurities of different types and/or concentrations. For example, the source/drain regions 150 may include n-type doped silicon (Si) or p-type doped silicon germanium (SiGe). In example embodiments, the source/drain regions 150 may include a plurality of regions including different concentrations of elements and/or doping elements.

The gate structure 160 may be disposed to intersect the active region 105 and extend lengthwise in the Y direction. A channel region of the transistor may be formed in the active region 105 intersecting the gate structure 160. The gate structure 160 may include a gate electrode 165, a gate dielectric layer 162 between the gate electrode 165 and the active region 105, spacer layers 164 on side surfaces of the gate electrode 165, and a gate capping layer 166 on the upper surface of the gate electrode 165.

The gate dielectric layer 162 may include an oxide, nitride, or high-k material. The high-k material may refer to a dielectric material having a higher dielectric constant than that of a silicon oxide layer ($SiO_2$). The high dielectric constant material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may include a conductive material, and for example, may include a metal nitride such as titanium nitride (TiN), tantalum nitride (TaN), or tungsten nitride (WN), and/or a metallic material such as aluminum (Al), tungsten (W) or molybdenum (Mo), or a semiconductor material such as doped polysilicon. The gate electrode 165 may be formed of two or more multi-layers.

The spacer layers 164 may be disposed on both side surfaces of the gate electrode 165, contacting the side surfaces of the gate electrode 165, and may extend in a Z direction perpendicular to the upper surface of the substrate 101. The spacer layers 164 may insulate the source/drain regions 150 from the gate electrodes 165. The spacer layers 164 may have a multilayer structure according to example embodiments. The spacer layers 164 may be formed of oxide, nitride, or oxynitride, and in detail, may be formed of a low-k film.

The gate capping layer 166 may be disposed on the upper surface of the gate electrode 165, and may contact the upper surface of the gate electrode 165. The gate capping layer 166 may be disposed in a form in which upper portions of the gate dielectric layer 162, the gate electrode 165, and the spacer layers 164 are recessed and filled. Accordingly, the gate capping layer 166 may have a downwardly convex curved bottom surface and a substantially flat upper surface. The gate capping layer 166 may be formed of oxide, nitride, and oxynitride, and in detail, may include at least one of SiO, SiN, SiCN, SiOC, SiON, and SiOCN.

The contact structures 181 and 182 may include a first contact structure 181 connected to the source/drain regions 150 and a second contact structure 182 connected to the gate electrode 165. The first contact structure 181 may extend between the gate structures 160 to contact the source/drain regions 150. The second contact structure 182 may penetrate the gate capping layer 166 to contact the gate electrode 165. The contact structures 181 and 182 may be electrically connected to the first interconnection layers 210 through the lower vias 191 and 192, respectively. The first interconnection layer 210 may be electrically connected to the source/drain regions 150. The contact structures 181 and 182 may include a barrier layer and a plug layer. The barrier layer may include a metal nitride, for example, at least one of titanium nitride (TiN), tantalum nitride (TaN), and tungsten nitride (WN). The plug layer may include a metal, for example, at least one of copper (Cu), tungsten (W), cobalt (Co), ruthenium (Ru), or molybdenum (Mo). The contact structures 181 and 182 may further include a metal-semiconductor compound layer such as cobalt silicide (CoSi), titanium silicide (TiSi), nickel silicide (NiSi), and tungsten silicide (WSi).

The upper structure of the semiconductor device 100*g* corresponds to the upper structure described with reference to FIGS. 1 and 2, but the upper structure described with reference to FIGS. 3A to 7 may also be applied to the semiconductor device 100*g*.

Figure 11:
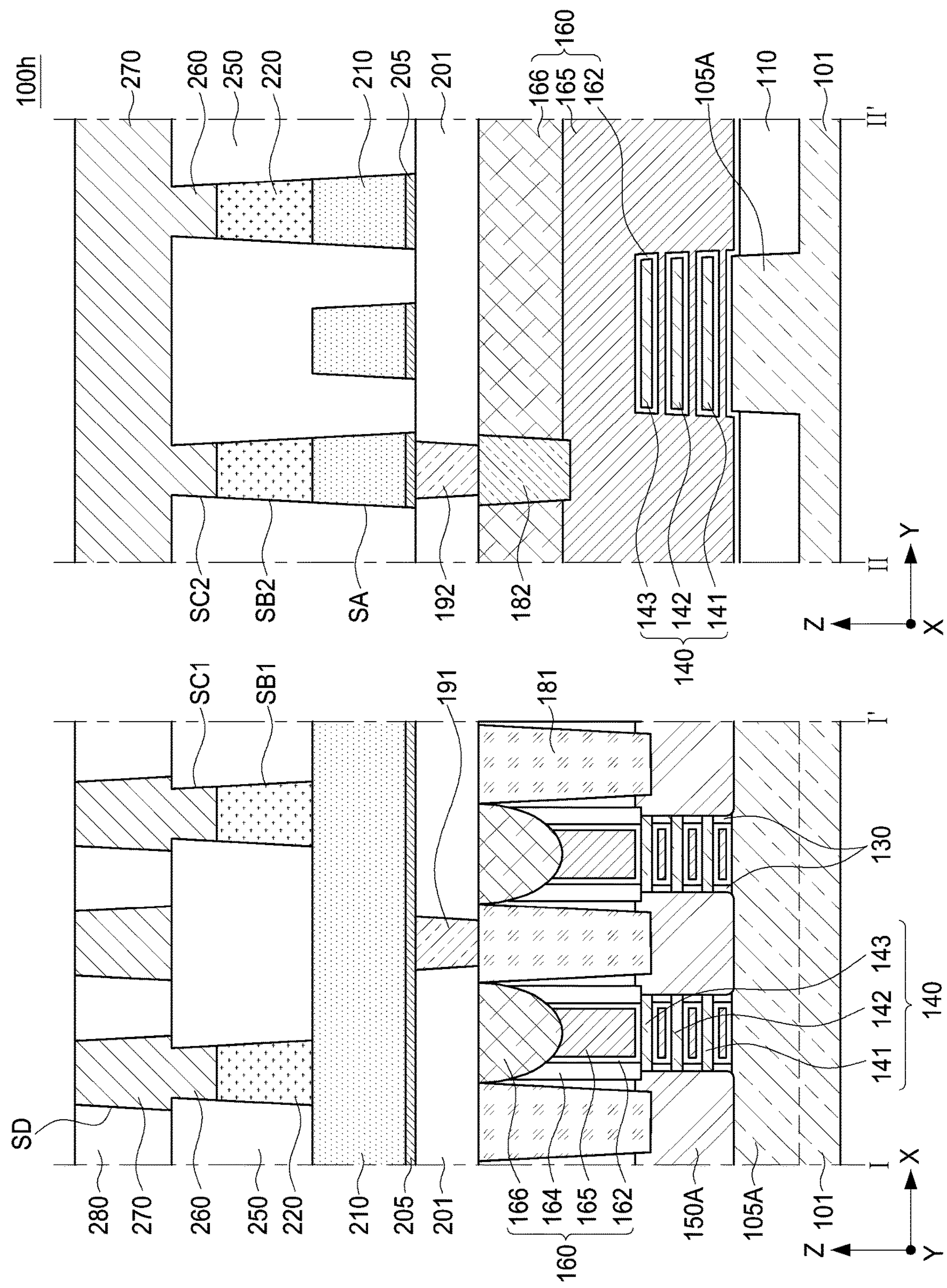
FIG. 11 is a cross-sectional view illustrating a semiconductor device, according to example embodiments.

FIG. 11 is a cross-sectional view illustrating a semiconductor device according to example embodiments. FIG. 11 illustrates regions corresponding to those of FIG. 2 and illustrates components constituting the lower structure together.

The lower structure of a semiconductor device 100*h* may further include an active region including an active fin 105A and a channel structure 140 in which a plurality of channel layers 141, 142, and 143 are disposed on the active fin 105A. Hereinafter, only a structure different from the semiconductor device 100*f* of FIG. 10 will be described.

In the semiconductor device 100*h*, the active fin 105A has a fin structure, and the gate electrode 165 may be disposed between the active fin 105A and the channel structure 140, between a plurality of channel layers 141, 142, and 143 of the channel structure 140, and on the channel structure 140. Accordingly, the semiconductor device 100*h* may include the multi-bridge channel FET (MBCFET™) formed by the channel structure 140, the source/drain regions 150A, and the gate electrode 165.

The channel structure 140 may include first to third channel layers 141, 142, and 143, which are two or more channel layers disposed on the active fin 105A to be spaced apart from each other in a direction perpendicular to the upper surface of the active fin 105A, for example, in the third direction (Z direction). The first to third channel layers 141, 142, and 143 may be spaced apart from the upper surface of the active fin 105A while being connected to the source/drain region 150A. The first to third channel layers 141, 142, and 143 may be surrounded by the gate dielectric layer 162 and the gate electrode 165, between the source/drain regions 150A. The first to third channel layers 141, 142, and 143 may be formed of a semiconductor material, and may include at least one of, for example, silicon (Si), silicon germanium (SiGe), and germanium (Ge). The first to third channel layers 141, 142, and 143 may be formed of, for example, the same material as the substrate 101. The number and shape of the channel layers 141, 142, and 143 constituting one channel structure 140 may be variously changed in example embodiments.

The upper structure of the semiconductor device 100*h* corresponds to the upper structure described with reference to FIGS. 1 and 2, but the upper structure described with reference to FIGS. 3A to 7 of this specification may be applied to the semiconductor device 100*h*.

FIGS. 12A to 17B are diagrams illustrating a process sequence to describe a method of manufacturing a semiconductor device according to example embodiments. FIGS. 12B, 13B, 14B, 15B, 16B and 17B are drawings illustrating the cross-sections taken along lines I-I' and II-II' of FIGS. 12A, 13A, 14A, 15A, 16A, and 17A, respectively, according to the process sequence.

Figure 12A:
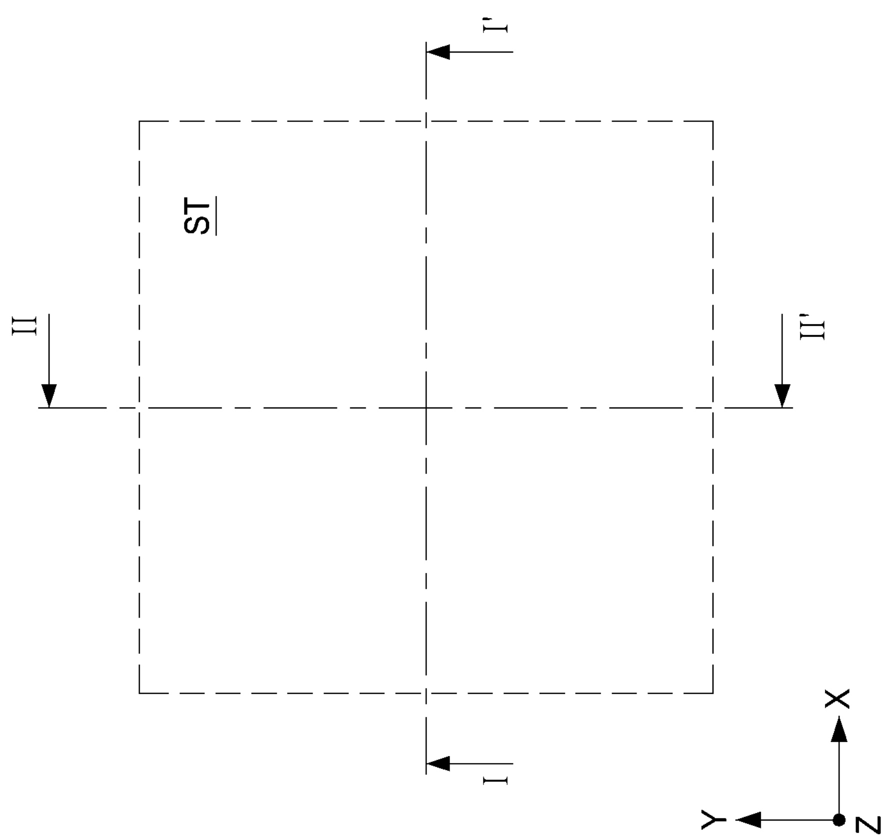
FIGS. 12A-12B, 13A-13B, 14A-14B, 15A-15B, 16A-16B, and 17A-17B are diagrams illustrating a process sequence to describe a method of manufacturing a semiconductor device, according to example embodiments.
Figure 12B:
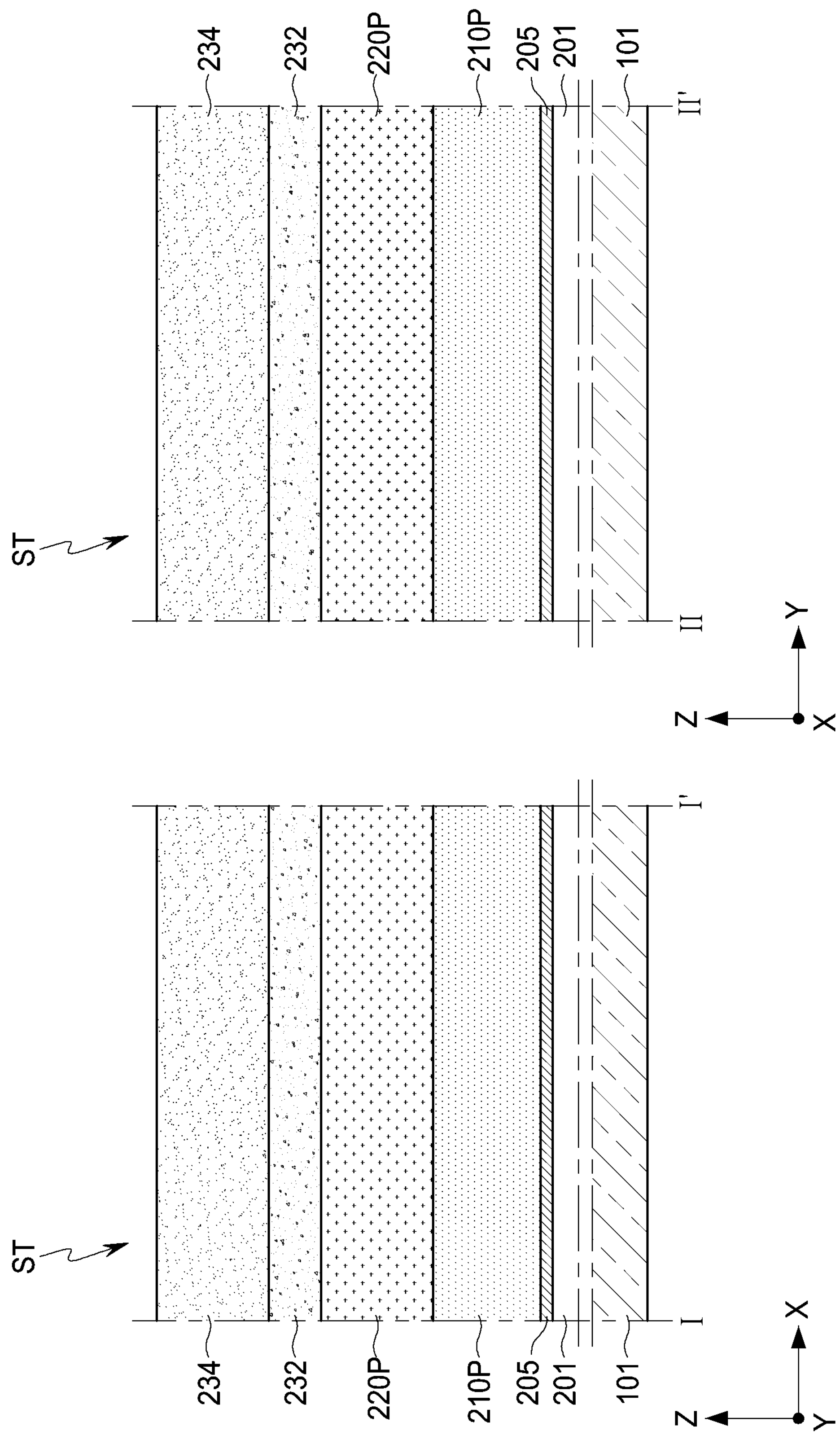

Referring to FIGS. 12A and 12B, an insulating layer 201, a first barrier layer 205, a first metal layer 210P, a second metal layer 220P, a first mask layer 232, and a second mask layer 234 may be stacked on the substrate 101 on which an integrated circuit is disposed, thereby forming a stack structure ST.

The integrated circuit may be first formed on the substrate 101, and then the insulating layer 201 may be formed on the integrated circuit. The active regions 105 and 105A, the gate structure 160, and the source/drain regions 150A described with reference to FIGS. 10 and 11 may be formed on the substrate 101.

The insulating layer 201 may be formed of silicon oxide or a low-k material having a dielectric constant lower than that of silicon oxide. The first barrier layer 205 may be formed on the insulating layer 201.

The stacked structure ST may be formed by sequentially depositing the first metal layer 210P, the second metal layer 220P, the first mask layer 232, and the second mask layer 234. Each of the first metal layer 210P and the second metal layer 220P may include, for example, at least one of ruthenium (Ru), molybdenum (Mo), tungsten (W), copper (Cu), and cobalt (Co). The second metal layer 220P may include a metal different from that of the first metal layer 210P to have an etch selectivity with respect to the first metal layer 210P. Each of the first mask layer 232 and the second mask layer 234 may be formed of at least one of TiO, TiN, TiON, AlO, AlN, AlOC, SiO, SiN, SiON, SiCN, WCN, and WN, or may be formed of a carbon-containing material layer such as an amorphous carbon layer (ACL) or Spin-On Hardmask (SOH). The first mask layer 232 may be a hard mask layer. The first mask layer 232 may also include a plurality of mask layers.

In an example embodiment, the first metal layer 210P may include a plurality of metal layers including different metals. In this case, an uppermost metal layer of the first metal layer 210P, and the second metal layer 220P, may include different metals. The second metal layer 220P may include a plurality of metal layers including different metals. In this case, a lowermost metal layer of the second metal layer 220P, and the first metal layer 210P, may include different materials. Thereafter, by performing subsequent processes, the semiconductor device of FIGS. 3A and 3B may be manufactured.

Figure 13A:
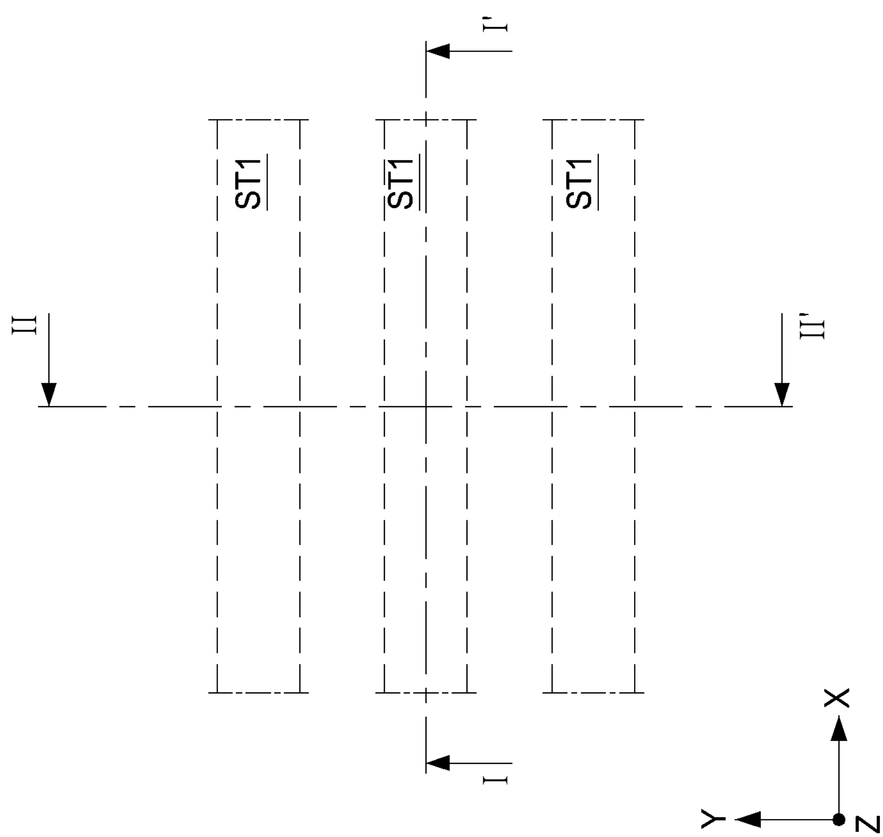
Figure 13B:
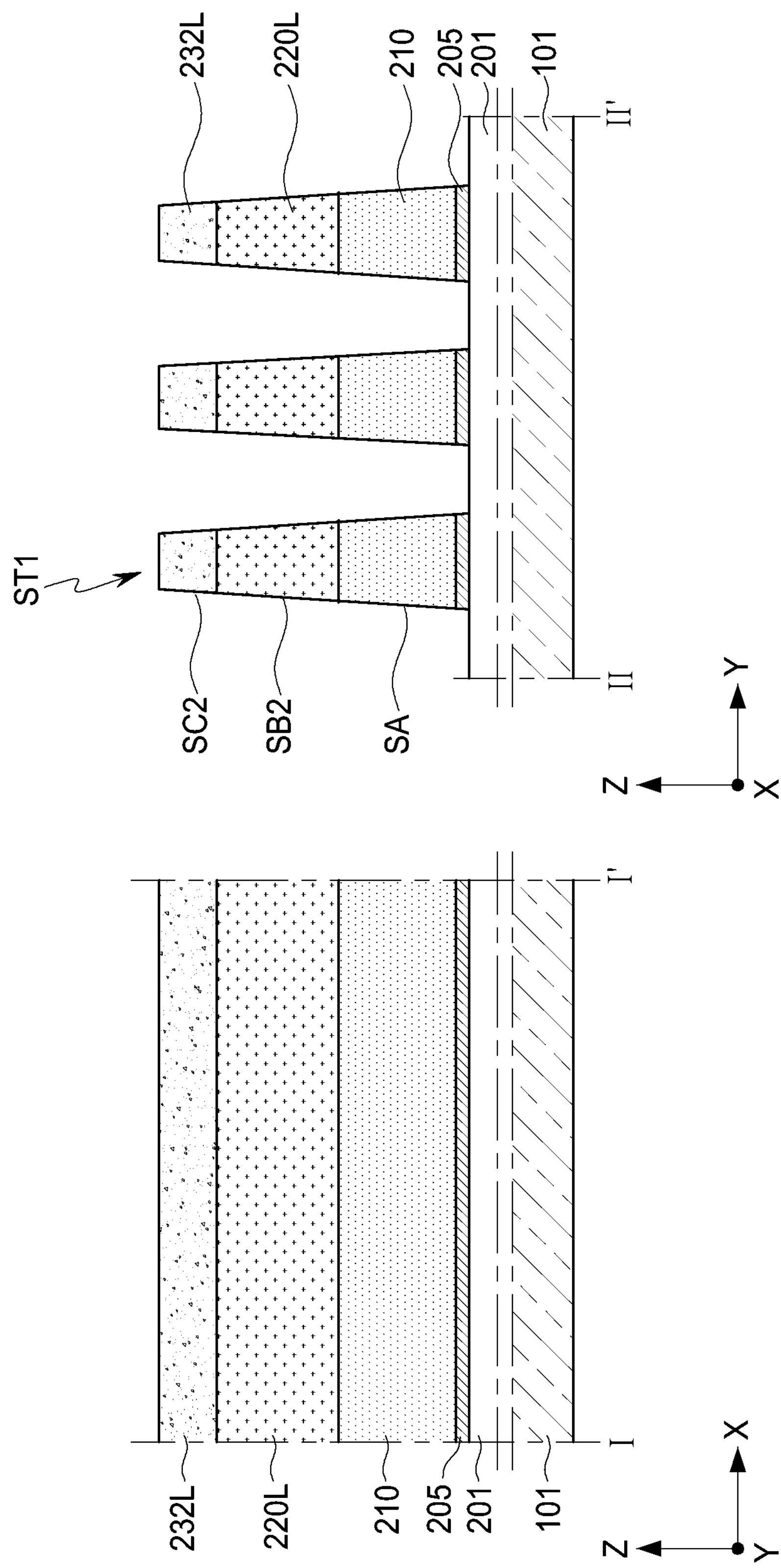

Referring to FIGS. 13A and 13B, by performing a first etching process on the first metal layer 210P, the second metal layer 220P and the first mask layer 232, the first interconnection layer 210, a metal line pattern 220L and a mask line pattern 232L may be formed.

After a separate photoresist is formed on the first mask layer 232 and the second mask layer 234, the first etching process may be performed using the photoresist. The first metal layer 210P, the second metal layer 220P, and the first mask layer 232 are etched through the first etching process to form first structures ST1 including a first interconnection layer 210, a metal line pattern 220L, and a mask line pattern 232L. The first structures ST1 may have a line shape extending lengthwise in the X direction in a plan view.

For example, by the first etching process, the first metal layer 210P may be formed of a plurality of first interconnection layers 210 separated from each other in the Y direction. By the first etching process, the second metal layer 220P may be formed of a plurality of metal line patterns 220L separated from each other in the Y direction. Through the first etching process, the first mask layer 232 may be formed of a plurality of mask line patterns 232L separated from each other in the Y direction. The second mask layer 234 may be removed after the first etching process or during the first etching process. By the first etching process, the first barrier layer 205 may also be separated in the Y direction.

In this operation, the first structure ST1 may have inclined surfaces in which a width of the first structure ST1 in the Y direction becomes narrower towards an upper region of the first structure ST1 (e.g., in the Z direction). By the first etching process, the inclination angle of the side surfaces SA of the first interconnection layer 210 and the inclination angle of the side surfaces SB2 of the first via (refer to 'first via 220' in FIG. 2) may be determined. The side surfaces SC2 of the mask line pattern 232L may also have an inclination. In an example embodiment, the inclination angles may be different from each other due to a difference in etch selectivity, and then, subsequent processes may be performed, thereby manufacturing the semiconductor device of FIGS. 4A and 4B.

Figure 14A:
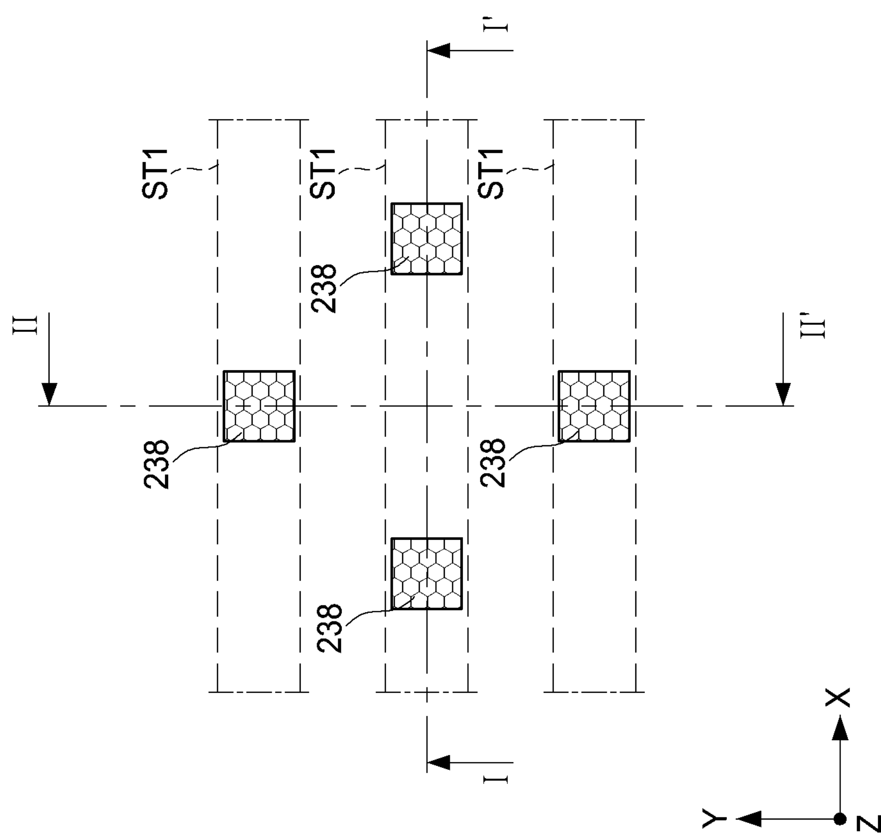
Figure 14B:
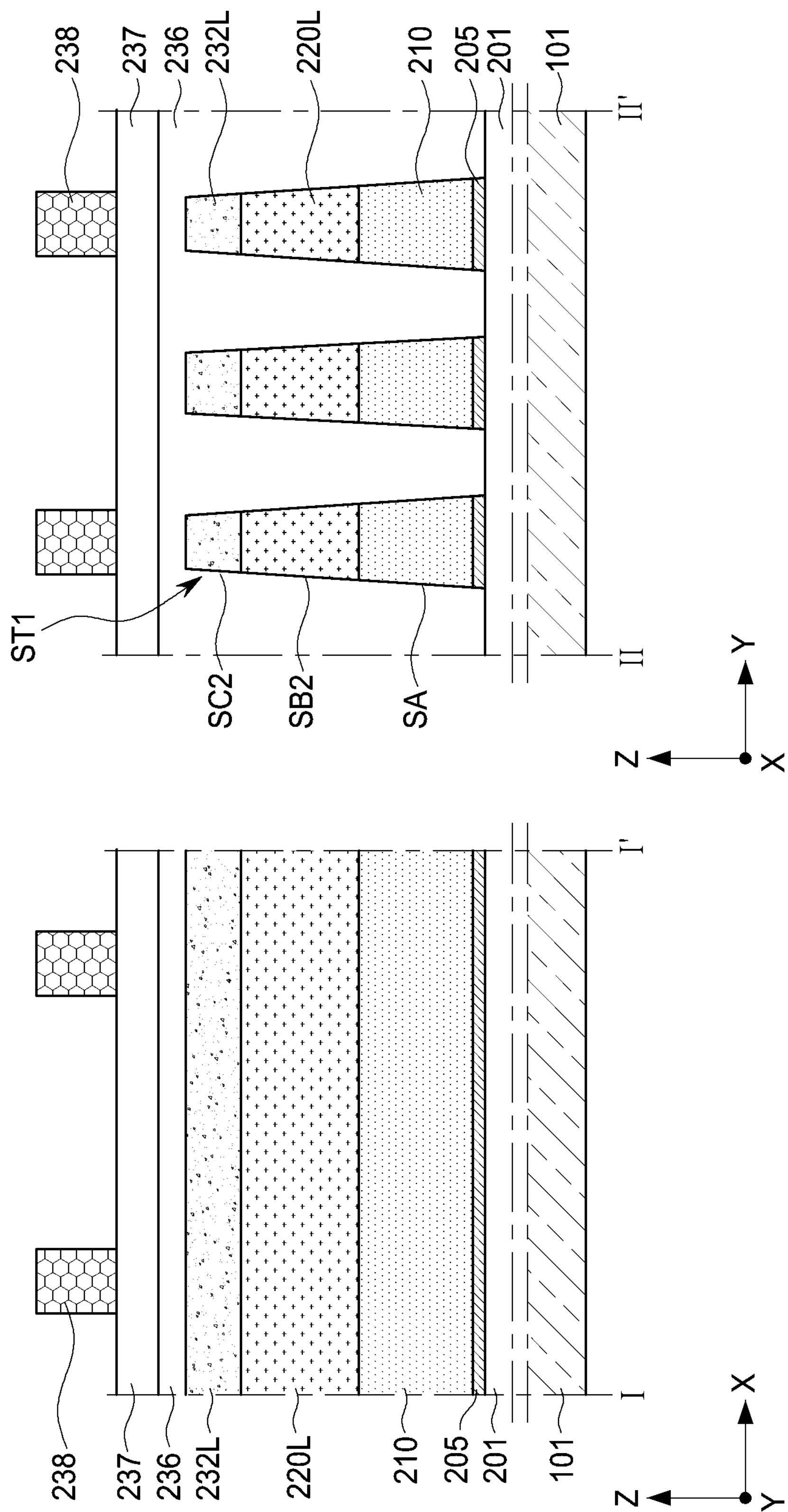

Referring to FIGS. 14A and 14B, a gap fill pattern 236 covering the first structures ST1, a third mask layer 237 on the gap fill pattern 236, and a photoresist 238 on the third mask layer 237 may be formed.

First, the gap fill pattern 236 may be formed to fill the space between the first structures ST1 by performing a chemical vapor deposition (CVD) process, for example, a flowable chemical vapor deposition (FCVD) process. The gap-fill pattern 236 may be formed up to a level higher than the upper surface of the first structure ST1. The gap-fill pattern 236 may also cover side surfaces of the first barrier layer 205. The gap-fill pattern 236 may be formed of a carbon-containing material layer such as an amorphous carbon layer (ACL) or a spin-on hardmask (SOH).

Next, after the third mask layer 237 is formed to cover the upper surface of the gap fill pattern 236, the photoresist 238 may be formed on the third mask layer 237. The third mask layer 237 may be formed of at least one of TiO, TiN, TiON, AlO, AlN, AlOC, SiO, SiN, SiON, SiCN, WCN, and WN. The photoresist 238 may be formed in an island type on a region in which the first via 220 is to be formed.

Figure 15A:
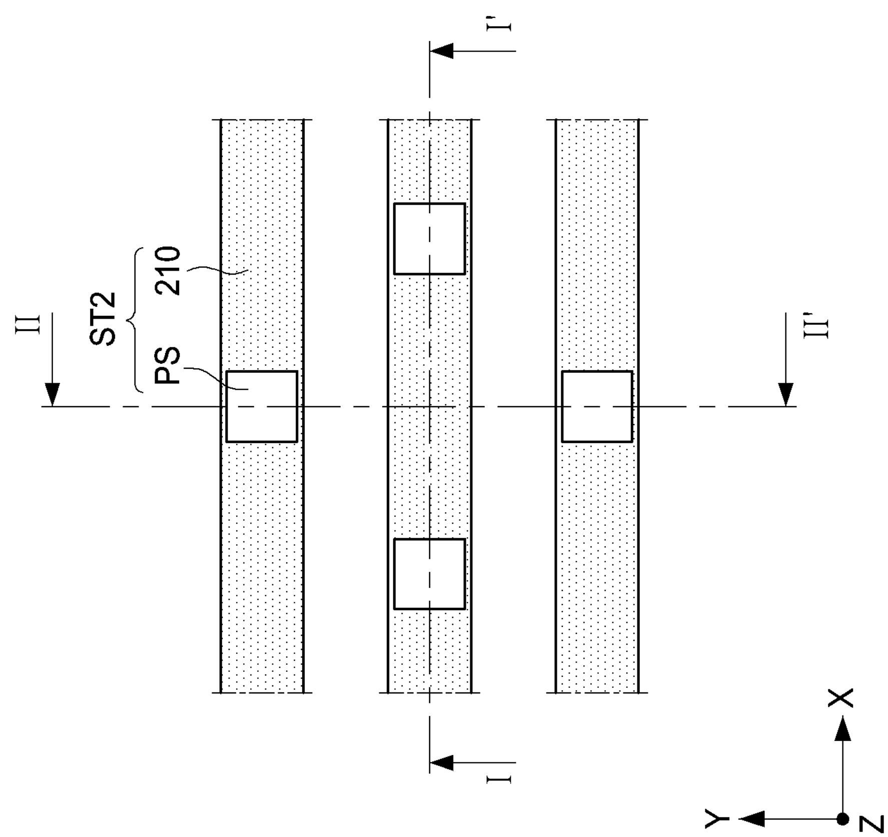
Figure 15B:
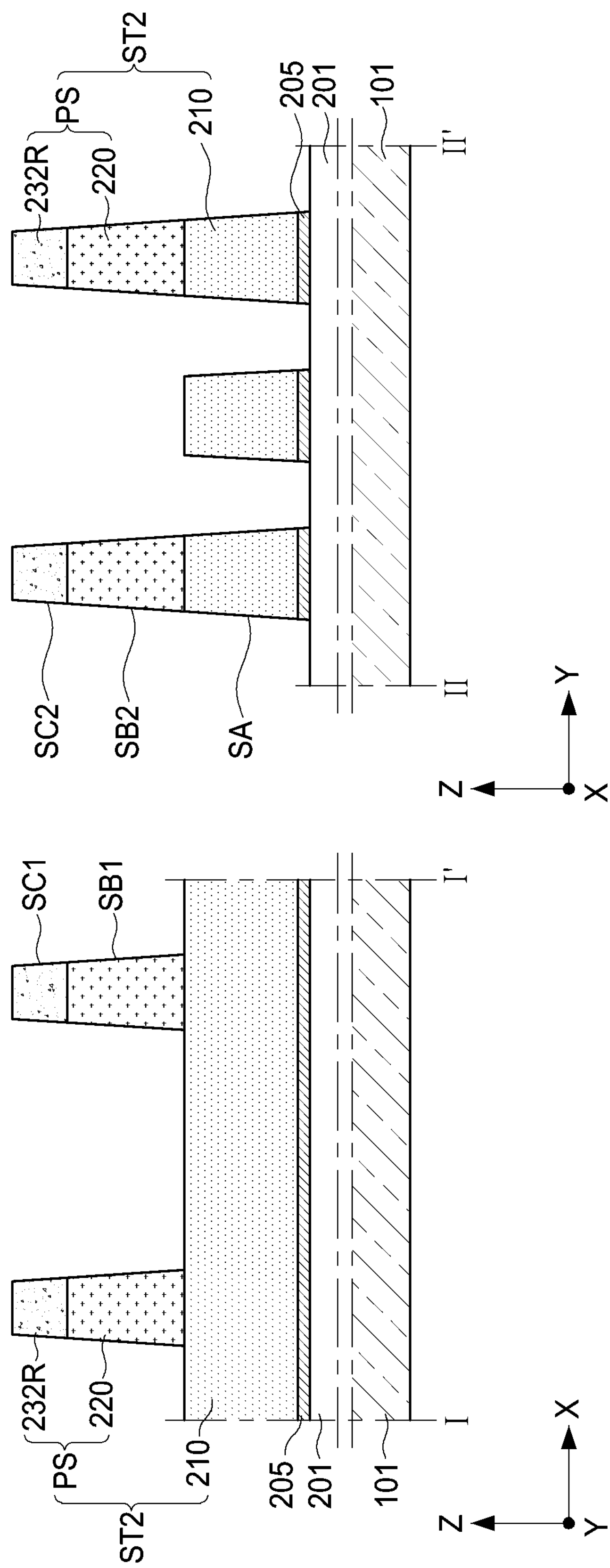

Referring to FIGS. 15A and 15B, a second etching process may be performed on the metal line pattern 220L and the mask line pattern 232L to form a first via 220 and a mask pattern layer 232R. The gap-fill pattern 236 may be removed.

The second etching process may be performed using the photoresist 238. In the second etching process, the metal line pattern 220L and the mask line pattern 232L may be etched to form preliminary via structures PS including the first via 220 and the mask pattern layer 232R. Accordingly, the second structure ST2 including the preliminary via structures PS and the first interconnection layer 210 may be formed.

For example, by the second etching process, the metal line pattern 220L may be formed of a plurality of first vias 220 separated from each other in the X direction. By the second etching process, the mask line pattern 232L may be formed of a plurality of mask pattern layers 232R separated from each other in the X direction. After the second etching process or during the second etching process, the third mask layer 237 and the photoresist 238 may be removed. After the second structures ST2 are formed, the gap-fill pattern 236 may be removed.

Due to the difference in etching selectivity, the second etching process may be performed until the upper surfaces of the first interconnection layers 210 are exposed. Accordingly, the second etching process may be performed only up to a required etching depth without providing a separate etch stop layer.

In this operation, the preliminary via structure PS of the second structure ST2 may have inclined side surfaces that become narrower in the X direction in an upward direction (e.g., in the Z direction). By the second etching process, the inclination angle of the side surfaces SB1 of the first via 220 and the inclination angle of the side surfaces SC1 of the mask pattern layer 232R may be determined.

In an example embodiment, the side surfaces SB1 and SB2 of the first via 220 may also have different inclination angles according to respective process conditions of the first and second etching processes, and then by performing the subsequent processes, the semiconductor device of FIG. 4C may be manufactured.

In an example embodiment, after this operation, after conformally forming the second barrier layer 240 covering the first barrier layer 205 and the second structure ST2, subsequent processes are performed, thereby manufacturing the semiconductor device of FIG. 5.

Figure 16A:
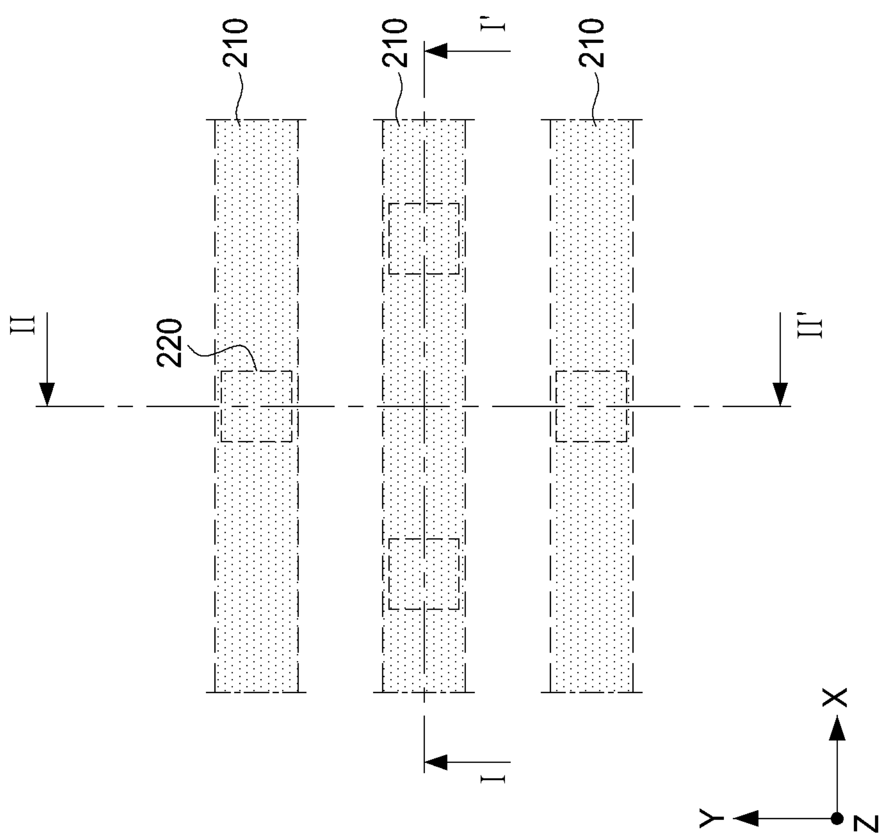
Figure 16B:
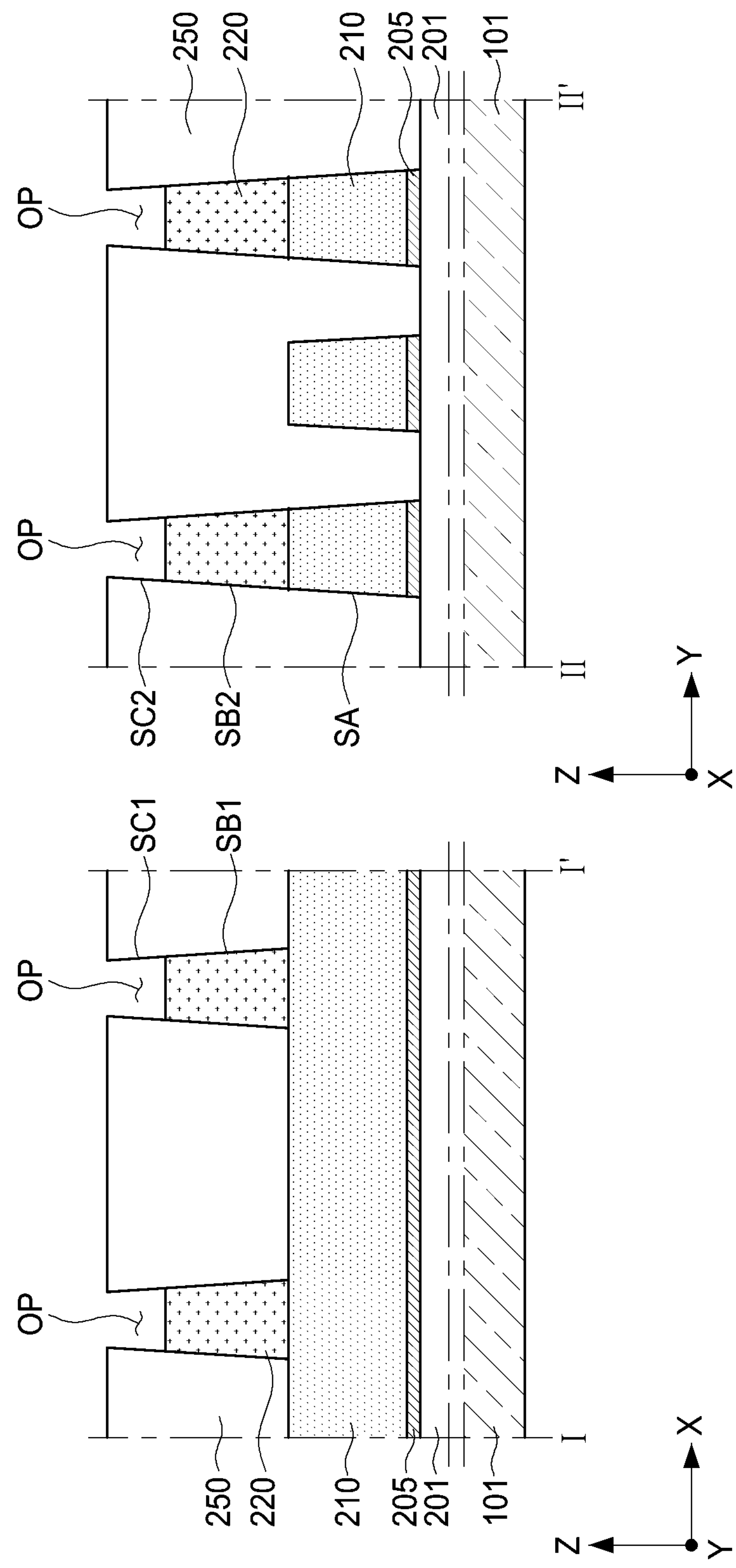

Referring to FIGS. 16A and 16B, after the first interlayer insulating layer 250 is formed and a planarization process is performed, the mask pattern layer 232R may be removed.

The first interlayer insulating layer 250 may be formed to fill a space between the second structures ST2 by performing a chemical vapor deposition (CVD) process, for example, a flowable chemical vapor deposition (FCVD) process. The first interlayer insulating layer 250 may also cover side surfaces of the first barrier layer 205. The first interlayer insulating layer 250 may be formed up to a level higher than the upper surface of the second structures ST2. Thereafter, a portion of the first interlayer insulating layer 250 may be removed by performing a planarization process until the upper surface of the mask pattern layer 232R is exposed. In an example embodiment, after performing the planarization process, an etch stop layer may be further formed on the first interlayer insulating layer 250. The etch stop layer may include TiN, WCN, or SiCN, or may include a bi-layer (e.g., AlN/SiCO), or a tri-layer (e.g., AlN/SiOC/AlOx, AlOx/SiCO/AlOx).

The mask pattern layer 232R may be selectively removed with respect to the first interlayer insulating layer 250 and the first via 220. The removal process of the mask pattern layer 232R may use at least one of wet etching and dry etching. An upper surface of the first via 220 may be exposed to an opening OP formed by removing the mask pattern layer 232R.

Figure 17A:
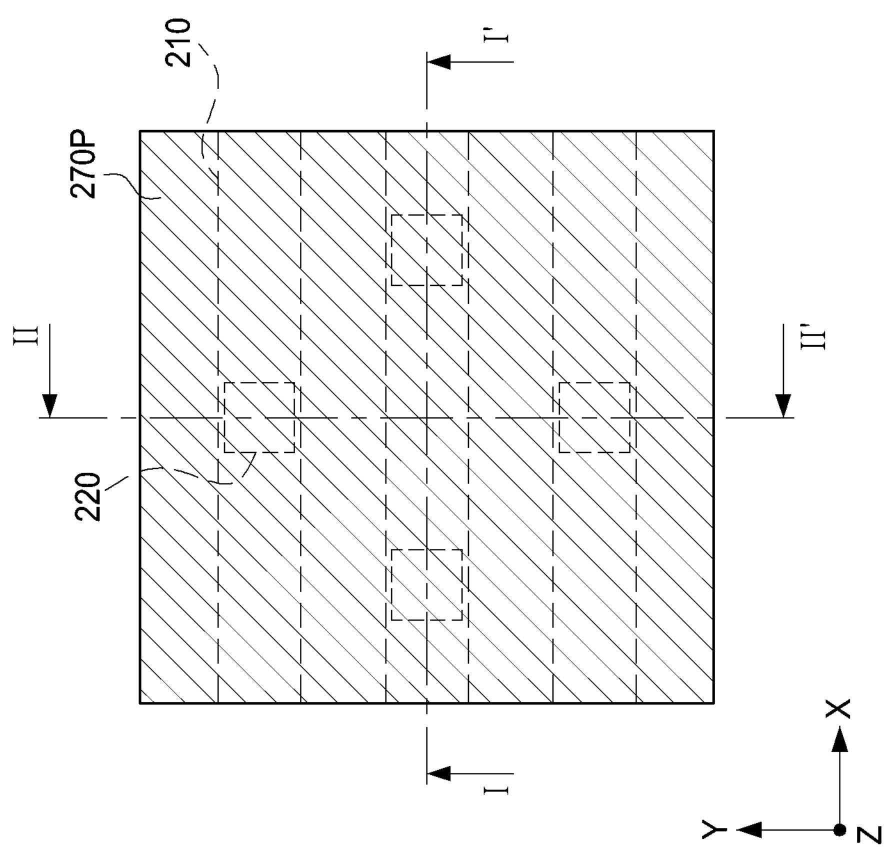
Figure 17B:
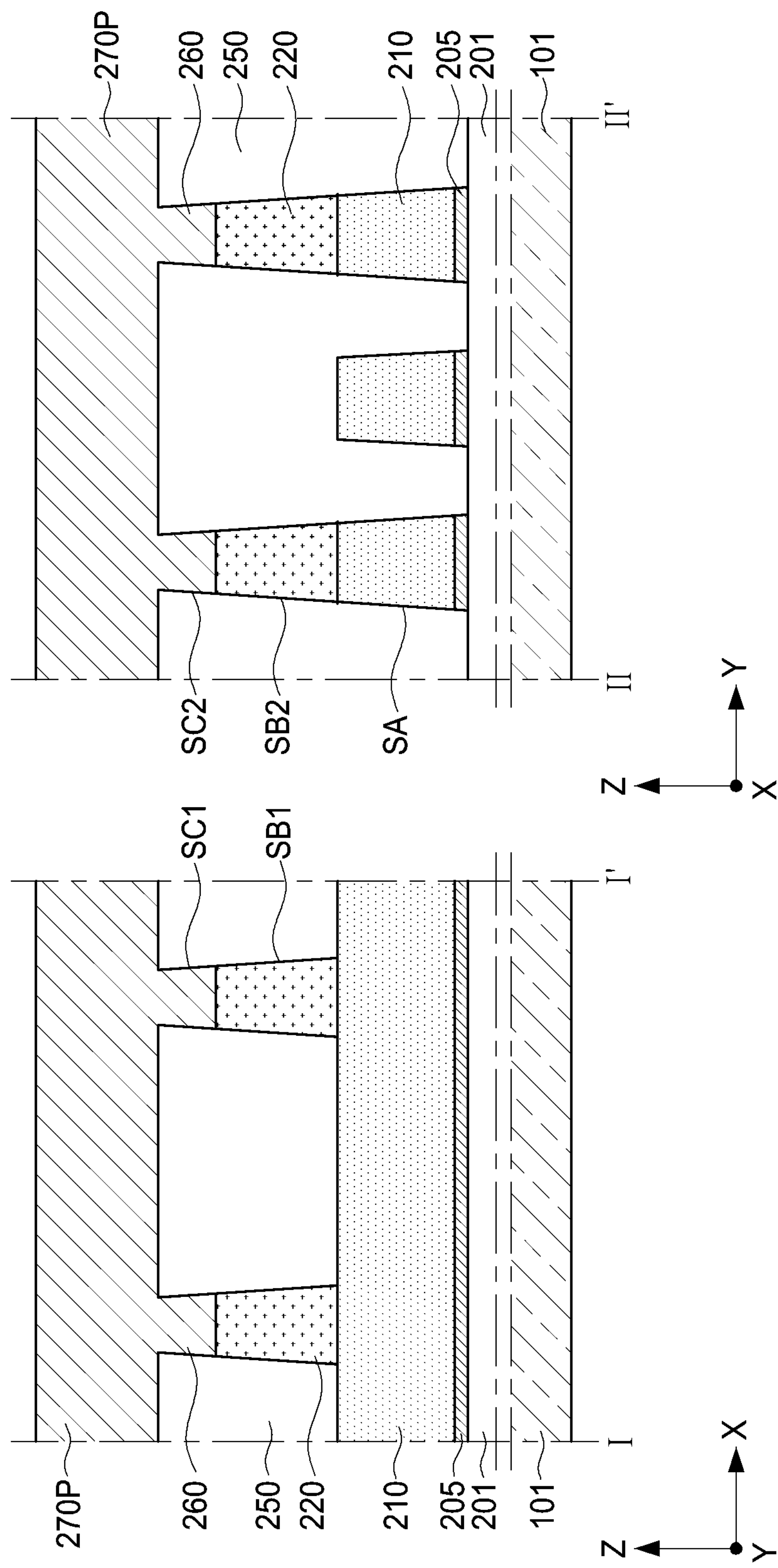

Referring to FIGS. 17A and 17B, a third metal layer 270P may be formed on the first interlayer insulating layer 250 while filling the opening OP with the second via 260.

The second via 260 may be connected to the first via 220 while filling the opening OP. The second via 260 may be self-aligned on an upper portion of the first via 220. The third metal layer 270P is formed in the same process operation as that of the second via 260, and may be formed to cover the upper surface of the first interlayer insulating layer 250. In the third metal layer 270P, the second via 260 may be formed of at least one of, for example, ruthenium (Ru), molybdenum (Mo), tungsten (W), copper (Cu), and cobalt (Co).

Next, referring to FIGS. 1 and 2 together, a second interconnection layer 270 is formed by patterning the third metal layer 270P, and a second interlayer insulating layer 280 may be formed in a region from which the third metal layer 270P has been partially removed. Accordingly, the semiconductor device of FIGS. 1 to 2 may be manufactured.

Figure 18A:
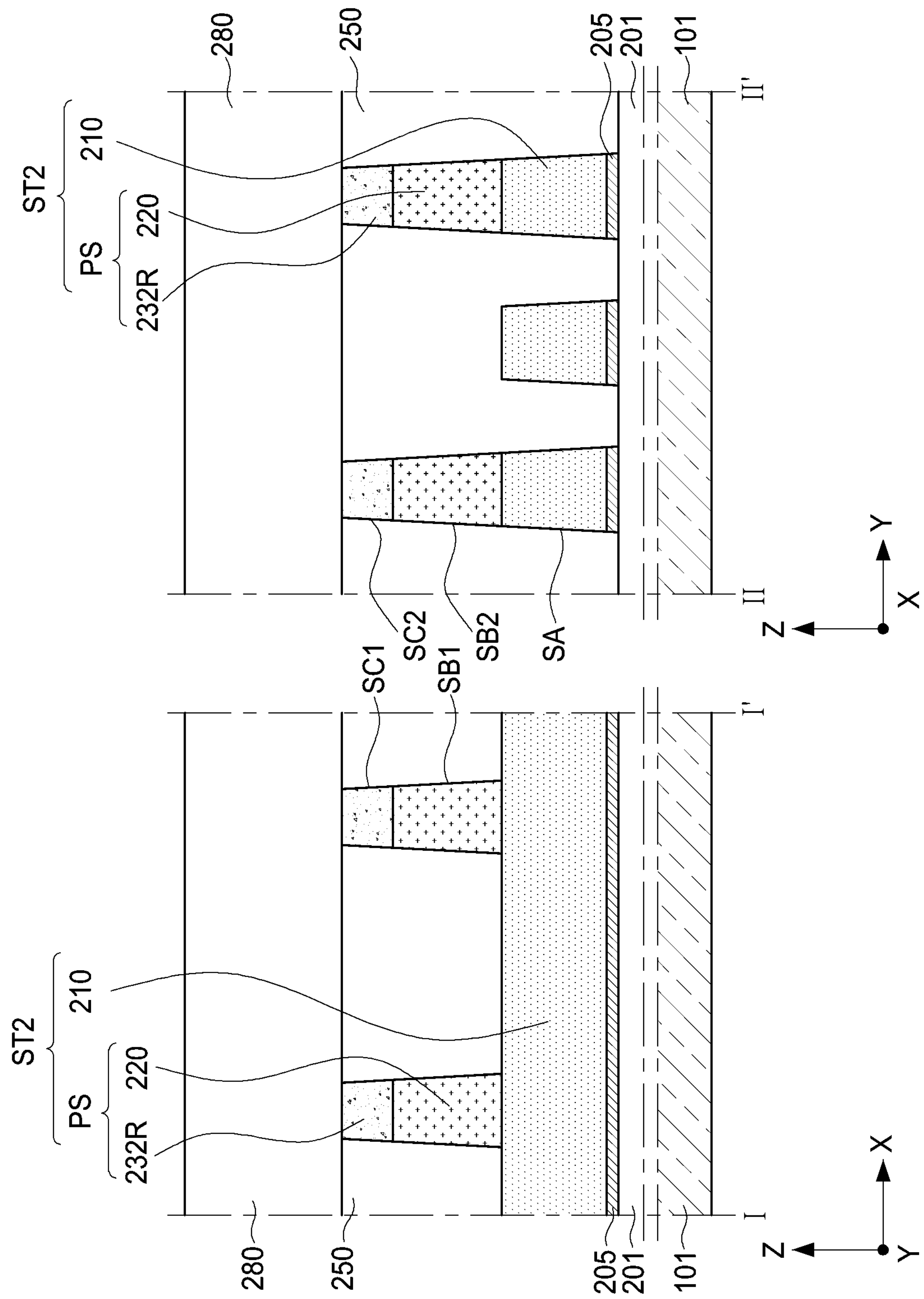
FIGS. 18A and 18B are diagrams illustrating some operation of a method of manufacturing a semiconductor device, according to example embodiments.
Figure 18B:
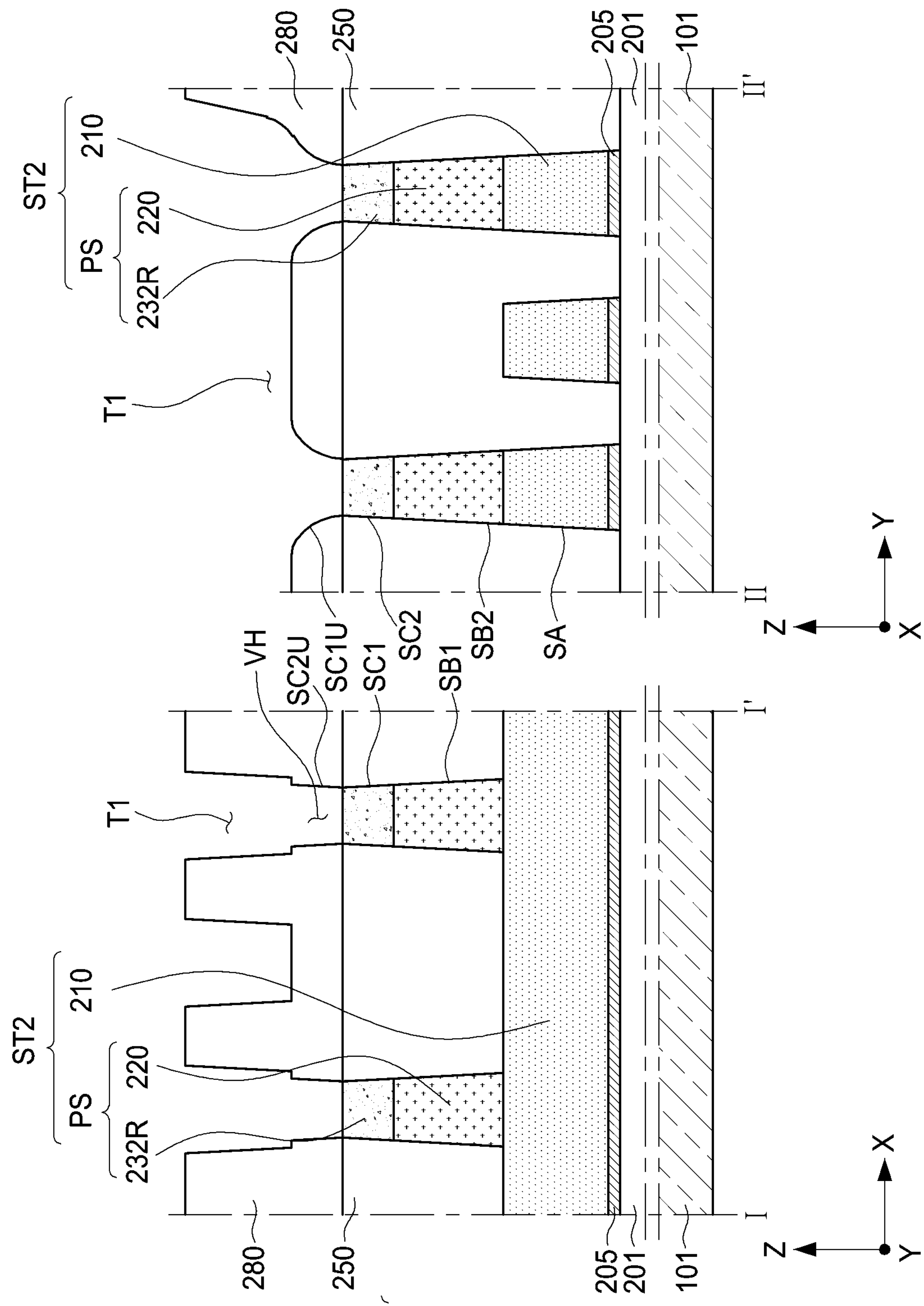

FIGS. 18A and 18B are diagrams illustrating some operations of a method of manufacturing a semiconductor device according to example embodiments.

First, referring to FIG. 18A, as described above with reference to FIGS. 12A to 16B, the substrate 101, the insulating layer 201, the first barrier layer 205, the second structure ST2, and the first interlayer insulating layer 250 are formed, and then, the second interlayer insulating layer 280 may be formed without removing the mask pattern layer 232R. In an example embodiment, after performing a planarization process on the first interlayer insulating layer 250 and before forming the second interlayer insulating layer 280, an etch stop layer may further be formed on the first interlayer insulating layer 250. The etch stop layer may include TiN, WCN, or SiCN, or may include a bi-layer (e.g., AlN/SiCO), or a tri-layer (e.g., AlN/SiOC/AlOx, AlOx/SiCO/AlOx). The etch stop layer may be partially removed from the lower portion of the via hole VH while forming the via hole VH in FIG. 18B. Next, referring to FIG. 18B, a portion of the second interlayer insulating layer 280 may be removed to form a via hole VH exposing the upper surface of the mask pattern layer 232R and a first trench T1 connected to the via hole VH. The via hole VH may have inclined side surfaces SC1U and SC2U in which a width of the via hole VH becomes wider towards an upper region of the via hole VH. The width of the first trench T1 may also increase towards an upper region of the first trench T1.

Next, after the mask pattern layer 232R is removed, the region from which the mask pattern layer 232R has been removed, the via hole VH, and the first trench T1 are filled with a metal to form a second via 260' and a second interconnection layer 270'. Thereby, the semiconductor device of FIG. 6A may be manufactured.

In an example embodiment, before forming the second interlayer insulating layer 280 in FIG. 18A, a planarization process may be performed until the upper surface of the first via 220 is exposed, or the first interlayer insulating layer 250 may be formed in a state in which the mask pattern layer 232R has been removed in FIGS. 15A and 15B, and the process operation of FIG. 18B may be performed, thereby manufacturing the semiconductor device of FIG. 6B.

Figure 19A:
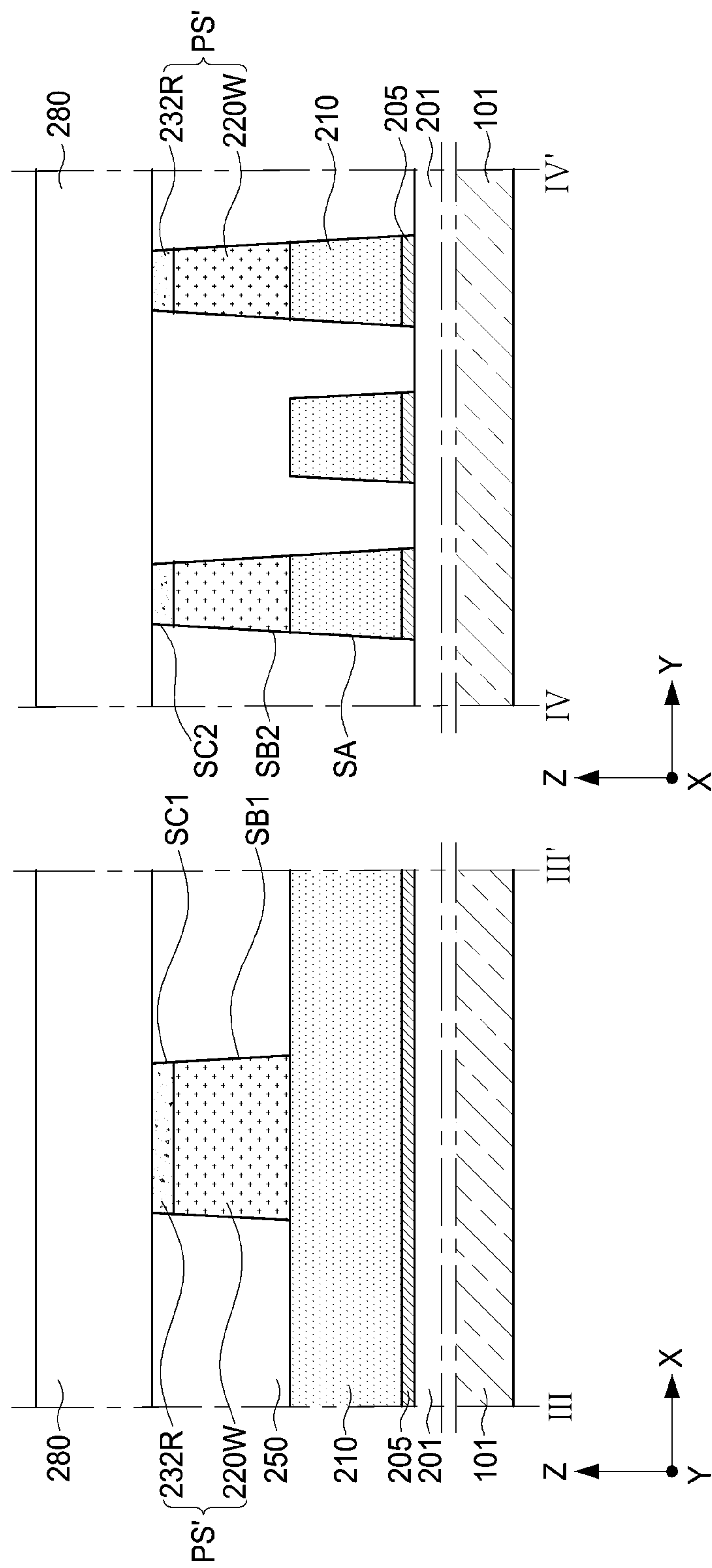
FIGS. 19A and 19B are diagrams illustrating some operation of a method of manufacturing a semiconductor device, according to example embodiments.
Figure 19B:
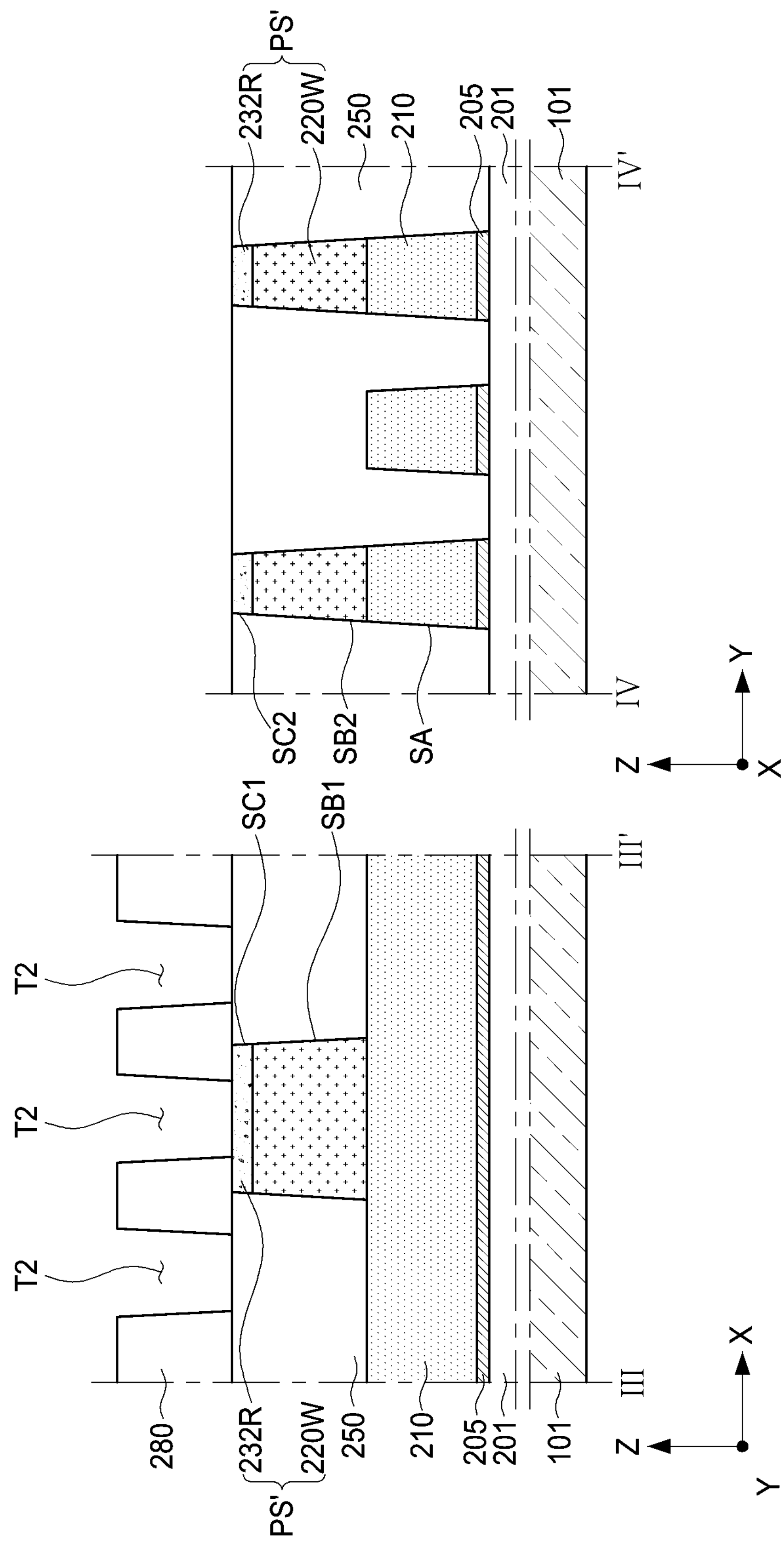

FIGS. 19A and 19B are diagrams illustrating some operations of a method of manufacturing a semiconductor device according to example embodiments. FIGS. 19A and 19B are views illustrating cross-sections taken along lines and IV-IV' of FIG. 8 according to the process sequence.

First, referring to FIG. 19A, a preliminary via structure PS' may be formed in such a manner that the width of the preliminary via structure PS' in the X direction is greater than the width in the Y direction. For example, the widths of a second via 220W and the mask pattern layer 232R in the X direction may be greater than the widths in the Y direction. As described above with reference to FIG. 18A, the second interlayer insulating layer 280 may be formed without removing the mask pattern layer 232R. In an example embodiment, after performing a planarization process on the first interlayer insulating layer 250 and before forming the second interlayer insulating layer 280, an etch stop layer may further be formed on the first interlayer insulating layer 250. The etch stop layer may include TiN, WCN, or SiCN, or may include a bi-layer (e.g., AlN/SiCO), or a tri-layer (e.g., AlN/SiOC/AlOx, AlOx/SiCO/AlOx). The etch stop layer may be partially removed from the lower portion of the second trench T2 while forming the second trench T2 in FIG. 19B.

Next, referring to FIG. 19B, a portion of the second interlayer insulating layer 280 may be removed to form a second trench T2 exposing the upper surface of the mask pattern layer 232R. The width of the second trench T2 may be increased towards an upper region of the second trench T2.

Next, after a portion or the entirety of the mask pattern layer 232R is removed, second vias 260*b* and 260*b*' and the second interconnection layer 270 may be formed by filling a metal in the region from which the portion or the entirety of the mask pattern layer 232R has been removed and in the second trench T2. Thus, the semiconductor device of FIGS. 9A and 9B may be manufactured.

As set forth above, according to an example embodiment, by differentiating a first metal of a first interconnection layer and a second metal of a first via on the first interconnection layer, in contact with each other, the etch process may be stably performed, thereby providing a semiconductor device having improved electrical characteristics and reliability.

While example embodiments have been illustrated and described above, it will be apparent to those skilled in the art that modifications and variations could be made without departing from the scope of the present inventive concept as defined by the appended claims.

What is claimed is:

1. A semiconductor device comprising:

a lower structure including a substrate;

a first interconnection layer extending lengthwise in a first direction on the lower structure, and including a first metal;

a first via contacting a portion of an upper surface of the first interconnection layer and including a second metal different from the first metal;

a second via contacting at least a portion of an upper surface of the first via and having a maximum width narrower than a maximum width of the first via; and a second interconnection layer connected to the second via and extending lengthwise in a second direction, perpendicular to the first direction, wherein the first interconnection layer has inclined side surfaces in which a width of the first interconnection layer becomes narrower towards an upper region of the first interconnection layer, and wherein the first via has inclined side surfaces in which a width of the first via becomes narrower towards an upper region of the first via.

2. The semiconductor device of claim 1, wherein the first metal includes at least one of ruthenium (Ru), molybdenum (Mo), tungsten (W), copper (Cu), and cobalt (Co), and wherein the second metal includes at least one material different from the first metal, among ruthenium (Ru), molybdenum (Mo), tungsten (W), copper (Cu), and cobalt (Co).

3. The semiconductor device of claim 1, wherein the first via includes a plurality of first vias disposed on the first interconnection layer, to be spaced apart from each other in the first direction, and wherein a first separation distance between upper regions of the plurality of first vias adjacent to each other in the first direction is greater than a second separation distance between lower regions of the plurality of first vias adjacent to each other in the first direction.

4. The semiconductor device of claim 1, wherein the second via has inclined side surfaces in which a width of the second via becomes narrower towards an upper region of the second via, and wherein the second interconnection layer has inclined side surfaces in which a width of the second interconnection layer becomes narrower towards an upper region of the second interconnection layer.

5. The semiconductor device of claim 1, wherein the first interconnection layer includes a first conductive layer and a second conductive layer on the first conductive layer, wherein the first via is in contact with a portion of an upper surface of the second conductive layer, wherein the first conductive layer includes the first metal, and wherein the second conductive layer includes a metal different from each of the first metal and the second metal.

6. The semiconductor device of claim 1, wherein the first via includes a first via pattern and a second via pattern on the first via pattern, wherein the second via contacts at least a portion of an upper surface of the second via pattern, wherein the first via pattern includes the second metal, and wherein the second via pattern includes a metal different from each of the first metal and the second metal.

7. The semiconductor device of claim 1, wherein at least one of the inclined side surfaces of the first interconnection layer is inclined at a first angle with a lower surface of the first interconnection layer, wherein at least one of the inclined side surfaces of the first via is inclined at a second angle with a lower surface of the first via, and wherein the first angle is different from the second angle.

8. The semiconductor device of claim 1, wherein the inclined side surfaces of the first via include first side surfaces opposing each other in the first direction and second side surfaces opposing each other in the second direction, wherein the first side surfaces of the first via are inclined at a first angle with a lower surface of the first via, wherein the second side surfaces of the first via are inclined at a second angle with the lower surface of the first via, and wherein the first angle is different from the second angle.

9. The semiconductor device of claim 1, further comprising a barrier layer conformally covering the inclined side surfaces of the first interconnection layer, the inclined side surfaces of the first via, and side surfaces of the second via.

10. A semiconductor device comprising:

a plurality of first interconnection layers extending lengthwise in a first direction on a substrate, and spaced apart from each other in a second direction, perpendicular to the first direction;

a plurality of second interconnection layers disposed on the plurality of first interconnection layers, extending lengthwise in the second direction, and spaced apart from each other in the first direction; and a plurality of via structures disposed in at least a portion of regions in which the plurality of first interconnection layers and the plurality of second interconnection layers intersect, on a level between the plurality of first interconnection layers and the plurality of second interconnection layers, the plurality of via structures electrically connecting the plurality of first interconnection layers and the plurality of second interconnection layers to each other, wherein at least one of the plurality of first interconnection layers and the plurality of second interconnection layers has inclined side surfaces in which a width becomes wider towards a lower region of the at least one of the plurality of first interconnection layers and the plurality of second interconnection layers, wherein each of the plurality of via structures includes a portion having inclined side surfaces in which a width becomes wider towards a lower region of each of the plurality of via structures, wherein each of the plurality of first interconnection layers is formed of a first metal, wherein each of the via structures includes a metal layer including a second metal, and wherein the second metal is different from the first metal and is in contact with the first metal.

11. The semiconductor device of claim 10, wherein each of the plurality of second interconnection layers is formed of a third metal, and wherein the first metal and the third metal are the same or different from each other.

12. The semiconductor device of claim 11, wherein the first metal, the second metal, and the third metal are respectively one metal selected from ruthenium (Ru), molybdenum (Mo), tungsten (W), copper (Cu), and cobalt (Co).

13. The semiconductor device of claim 10, wherein each of the via structures includes a first via in contact with a portion of an upper surface of a first interconnection layer as one of the plurality of first interconnection layers, and a second via disposed on the first via and integrated with a second interconnection layer as one of the plurality of second interconnection layers.

14. The semiconductor device of claim 13, wherein the second via is self-aligned such that side surfaces of the second via are substantially coplanar with side surfaces of the first via.

15. The semiconductor device of claim 13, wherein the first via has inclined side surfaces in which a width of the first via becomes wider towards a lower region of the first via.

16. The semiconductor device of claim 13, wherein the second via includes a first portion having inclined side surfaces in which a width of the second via becomes wider towards an upper region of the second via.

17. The semiconductor device of claim 16, wherein the second via further includes a second portion disposed between the first portion and the first via, the second portion having inclined side surfaces in which a width of the second via becomes wider towards a lower region of the second via.

18. A semiconductor device comprising:

a lower structure including a substrate;

a plurality of first interconnection layers extending lengthwise on the lower structure in a first direction, and spaced apart from each other in a second direction, perpendicular to the first direction;

a plurality of second interconnection layers disposed on the plurality of first interconnection layers, extending lengthwise in the second direction, and spaced apart from each other in the first direction;

a first via in contact with a portion of an upper surface of one of the plurality of first interconnection layers;

a second via disposed between the first via and one second interconnection layer among the plurality of second interconnection layers and in contact with the first via;

a first interlayer insulating layer covering side surfaces of each of the plurality of first interconnection layers, the first via, and the second via; and a second interlayer insulating layer covering side surfaces of each of the plurality of second interconnection layers, wherein, in each of the plurality of first interconnection layers, a width of a lower region is greater than a width of an upper region, wherein a width of a lower region of the first via is greater than a width of an upper region thereof, wherein a width of a lower region of the second via is greater than a width of an upper region thereof, wherein each of the plurality of first interconnection layers is formed of a first metal, wherein the first via is formed of a second metal, and wherein the second metal is different from the first metal.

19. The semiconductor device of claim 18, wherein the first metal includes at least one of ruthenium (Ru), molybdenum (Mo), tungsten (W), copper (Cu), and cobalt (Co), and wherein the second metal includes at least one material different from the first metal among ruthenium (Ru), molybdenum (Mo), tungsten (W), copper (Cu), and cobalt (Co).

20. The semiconductor device of claim 18, wherein a maximum width of the second via is less than a maximum width of the first via, wherein the second via is integrated with the one second interconnection layer, and wherein an upper surface of the first interlayer insulating layer is located on a level higher than an upper surface of the first via.

* * * * *